United States Patent [19]

Nakagawa et al.

[11] Patent Number: 5,482,815
[45] Date of Patent: Jan. 9, 1996

[54] SILVER HALIDE PHOTOGRAPHIC PHOTOSENSITIVE MATERIAL

[75] Inventors: Kunihiro Nakagawa; Shoji Akaiwa; Seiichi Sumi; Kenichi Nishi, all of Tokyo, Japan

[73] Assignee: Mitsubishi Paper Mills Limited, Japan

[21] Appl. No.: 198,308

[22] Filed: Feb. 18, 1994

[30] Foreign Application Priority Data

| Feb. 22, 1993 | [JP] | Japan | 5-031555 |
| Apr. 30, 1993 | [JP] | Japan | 5-103903 |
| Apr. 30, 1993 | [JP] | Japan | 5-103904 |
| May 13, 1993  | [JP] | Japan | 5-111884 |

[51] Int. Cl.$^6$ .................................................. G03C 1/06
[52] U.S. Cl. .................... 430/264; 430/598; 430/611; 430/523; 430/531; 430/627; 430/950; 430/961; 430/551; 430/607; 430/604
[58] Field of Search ................................ 430/264, 598, 430/611, 523, 531, 627, 950, 961, 551, 607, 604

[56] References Cited

U.S. PATENT DOCUMENTS

| 4,142,894 | 3/1979 | Hori et al. | 430/950 |
| 4,396,706 | 8/1983 | Ishii et al. | 430/523 |
| 5,158,856 | 10/1992 | Usagawa | 430/264 |
| 5,244,773 | 9/1993 | Muramatsu et al. | 430/264 |
| 5,283,169 | 2/1994 | Goto | 430/603 |
| 5,288,590 | 2/1994 | Kuwabara et al. | 430/264 |

FOREIGN PATENT DOCUMENTS

| 0064861 | 11/1982 | European Pat. Off. . |
| 0490302 | 6/1992 | European Pat. Off. . |
| 3329746 | 2/1984 | Germany . |
| 62-257149 | 11/1987 | Japan . |
| 4306643 | 10/1992 | Japan . |

*Primary Examiner*—Thomas R. Neville
*Attorney, Agent, or Firm*—Cushman Darby & Cushman

[57] ABSTRACT

Disclosed is a silver halide photographic photosensitive material comprising a support and, provided thereon, at least one hydrophilic colloid layer including a photosensitive layer wherein the photosensitive layer comprises monodispersed silver halide grains having an average grain size of 0.2 micron or less and comprising at least 90 mol % of silver chloride, the photosensitive layer or a hydrophilic colloid layer provided on the same side of the support as the side on which the photosensitive layer is provided contains a hydrazine derivative, a hydrophilic colloid layer provided above the photosensitive layer contains a water-dispersible fine particle polymer, the photosensitive layer contains substantially no water-dispersible fine particle polymer, and amount of the water-dispersible fine particle polymer contained in the hydrophilic colloid layer is 1 g/m$^2$ or less and is 5% by weight or more based on the weight of gelatin contained in the hydrophilic colloid layer.

11 Claims, 1 Drawing Sheet

SILVER HALIDE PHOTOGRAPHIC PHOTOSENSITIVE MATERIAL

BACKGROUND OF THE INVENTION

The present invention relates to silver halide photographic photosensitive materials and more particularly to ultra-high contrast roomlight photosensitive materials used in printing plate making industry.

Recently, improvement in efficiency of the contact work in the field of printing has been demanded owing to complication of prints and development of scanners. For this purpose, photographic films of low sensitivity of as low as about $10^{-4}$–$10^{-5}$ of that of conventional contact films have been developed and have been put to practical use as contact films handleable under roomlight (under white fluorescent lamp from which ultraviolet ray has been excluded), namely, roomlight photosensitive materials. Performances required for such roomlight photosensitive materials are as follows: They are handleable under roomlight for a long time and have not only a high sensitivity to a light source of printers, but also a sufficient maximum density having a contrast equal to or higher than that of conventional darkroom photosensitive materials.

A special developer called lith developer has been used for providing high contrast and sufficient maximum density in this technical field. The lith developer contains only hydroquinone as a developing agent and concentration of free sulfite ion is considerably reduced by using the sulfite (preservative) in the form of an adduct with formaldehyde not so as to restrain the infectious developability. Therefore, the lith developers have serious defects that they are highly susceptible to oxidation with air and cannot be stored for longer than 3 days.

In order to obtain high contrast and sufficient maximum density, U.S. Pat. Nos. 4,224,401, 4,168,977, 4,166,742, 4,311,781, 4,272,606, 4,221,857 and 4,243,739 disclose methods of using hydrazine derivatives. Since according to these methods, sulfites of high concentration can be added to the developers, stability of the developers against oxidation with air is markedly improved as compared with the lith development.

However, for exhibiting sufficient effect of hydrazine derivatives, developers of relatively high pH are needed and besides, processing at high temperatures is necessary for completion of the processing in a short time. Therefore, it has become possible to carry out the processing at low temperatures and relatively low pH by adding amine compounds such as alkylamines and alkanolamines to developers as described in U.S. Pat. No. 4,269,929. However, since processing temperature and pH of these developers are still higher as compared with those of generally used developing systems for rapid processing and furthermore, amine compounds are contained in the developers, amount of the silver halide which dissolves into the developer is large to cause stain with silver of automatic developing machines and of photosensitive materials processed therein.

Moreover, development inhibitors (especially, heterocyclic compounds having mercapto group) have the action to inhibit the dissolution of the silver halide into developer, but in order that a sufficient effect of hydrazine derivatives can be obtained, a large amount of development inhibitors cannot be added to the photosensitive materials as in the case of other photosensitive materials containing no hydrazine derivatives. In view of this point, too, amount of the silver halide which dissolves into the developer increases to cause stain with silver.

Furthermore, it is customary for one skilled in the art to increase the content of silver chloride in the silver halide emulsion (or to increase it to 100%) or to use fine grain emulsions for making possible the long-term handling under roomlight, namely, for lowering the sensitivity to white fluorescent lamp from which the ultraviolet ray has been excluded and for still affording a high-contrast and sufficient maximum density. However, this method also accelerates dissolution of the silver halide into the developer to cause stain with silver of the developing tank in the automatic developing machines, the developing racks and the photosensitive materials processed therein.

On the other hand, when silver halide photographic photosensitive materials containing a hydrazine derivative are processed under a specific condition, the hydrazine derivative extraordinarily accelerates the development and as a result, numerous pepper fogs occur, dot images become too thick to perform proper contact operation or negative thin lines are ruptured. The above-mentioned specific condition means mainly the processing with a developer which has been exhausted due to oxidation with air with lapse of time.

Furthermore, roomlight photosensitive materials are required to be able to be handled for a long time under safelight (white fluorescent lamp from which ultraviolet ray has been removed). The photosensitive materials containing hydrazine derivatives are lower in safety as compared with those which contain no hydrazine derivatives and in the case of the former photosensitive materials, fogs are formed in the processing of normal period of time or dot area ratio increases considerably. Besides, compounds having a mercapto group are effective as inhibitors against the extraordinary development caused by hydrazine derivatives, but the roomlight photosensitive materials containing the compounds having a mercapto group are further inferior in safety against safety light and use of these compounds are not effective to solve the problems.

Nowadays, the prints in our everyday life include not only lines or letters, but also the combinations of lines or letters with photographic images. Furthermore, in addition to the prints of black and white colors or single color, those of full colors increase. In photomechanical process, a photographic image original is converted to a dot image original by a scanner (separated into the colors of the desired numbers in the case of color printing) and the dot image original and a line image original are put together and exposed and printed on one contact film photosensitive material. In this way, an original for printing is prepared. In the case of color prints, originals for four colors (or at least two colors) are prepared. Therefore, roomlight photosensitive materials are further required to have suitability for the above-mentioned color plate making. Technical points in color plate making and color printing will be explained below.

In color printing, lines called register marks are drawn at the peripheral portions of plates in order for the printing of four colors (or at least two colors) being able to be performed at correct position, and at the printing step, registration is effected by exactly fitting them for all of four colors (or at least two colors). The register marks will be explained. As shown in FIG. 1, the register marks are lines given around the image part (which finally becomes the print) and are used not only for registration, but also for showing the position to be folded or cut in bookbinding. If these do not meet in the respective plates, the prints considerably decrease in commercial value.

However, in the photographic photosensitive materials containing hydrazine derivatives, thin lines such as register marks are finely and sharply formed under proper exposing conditions as compared with thick lines because the nucleation infectious development with hydrazine derivatives is weak (this tendency is strengthened by reducing exposure since thin lines of negative are readily ruptured in the photosensitive materials of this type). Therefore, contact reversal photosensitive materials containing hydrazine derivatives have the problem that the register mark is apt to get out of position (inferior in registration) because it is thin and sharp. If the register mark gets out of position, of course, thin lines get out of position not only in peripheral portion, but also in the image portion and handleability is extremely inferior.

Furthermore, for roomlight photosensitive materials, it is demanded for realizing the plate making operation of the higher efficiency to shorten the vacuum contacting step carried out prior to exposing in a printer. In order to improve the performance to shorten the vacuum contacting step, use of a matting agent having a large particle size is effective. However, if the particle size is too large, the matting agent makes the silver halide emulsion layer locally thin or reduces quantity of light at the exposing step to generate pinholes. As a result, opaque time increases and efficiency of plate making operation rather deteriorates. The inventor have confirmed that when silver halide photographic photosensitive materials contain hydrazine derivatives, high-contrast images are obtained as mentioned above and furthermore, the pinholes generated frequently can be reduced. However, when a dye which reduces the sensitivity of photosensitive silver halide emulsions is added to the photosensitive emulsion layer or other hydrophilic colloid layers as in general roomlight photosensitive materials for inhibition of degradation of image quality caused by irradiation, since the irradiation is inhibited, the light does not reach the portion shaded by the large matting agent and non-black portions remain and many pinholes are generated even if hydrazine derivatives are contained. On the other hand, if the dye is not contained, sharpness of the images is lost due to degradation of image quality caused by the irradiation. Means for sufficient improvement has not yet been reported.

Furthermore, it is known that use of acylhydrazine compounds as described in U.S. Pat. Nos. 4,168,977, 4,224,401, 4,243,739, 4,269,929, 4,272,614 and 4,323,643 generate nitrogen gas during development treatment. This gas gathers in the film to form bubbles, which bring about uneven development to damage the resulting photographic images.

SUMMARY OF THE INVENTION

The first object of the present invention is to provide a roomlight photographic photosensitive material which has a proper contrast and a sufficient maximum density and which can be handled for a long time under roomlight.

The second object of the present invention is to provide a silver halide photographic photosensitive material which can be processed with a stable developer, is less in dissolution of the silver halide into the developer and less in stain with silver.

The third object of the present invention is to provide a silver halide photographic photosensitive material which affords printing plates excellent in registration and superior in handleability.

The fourth object of the present invention is to provide a silver halide photographic photosensitive material which is excellent in vacuum performance.

The fifth object of the present invention is to provide a silver halide photographic photosensitive material which produces few pinholes and forms images of high sharpness.

The sixth object of the present invention is to provide a silver halide photographic photosensitive material which hardly undergoes uneven development and generates few pepper fogs.

The seventh object of the present invention is to provide a silver halide photographic photosensitive material which is little in increase of sensitivity even if processed with a developer enhanced in activity due to exhaustion with time and is little in generation of pepper fogs.

DESCRIPTION OF THE INVENTION

Figure 1:
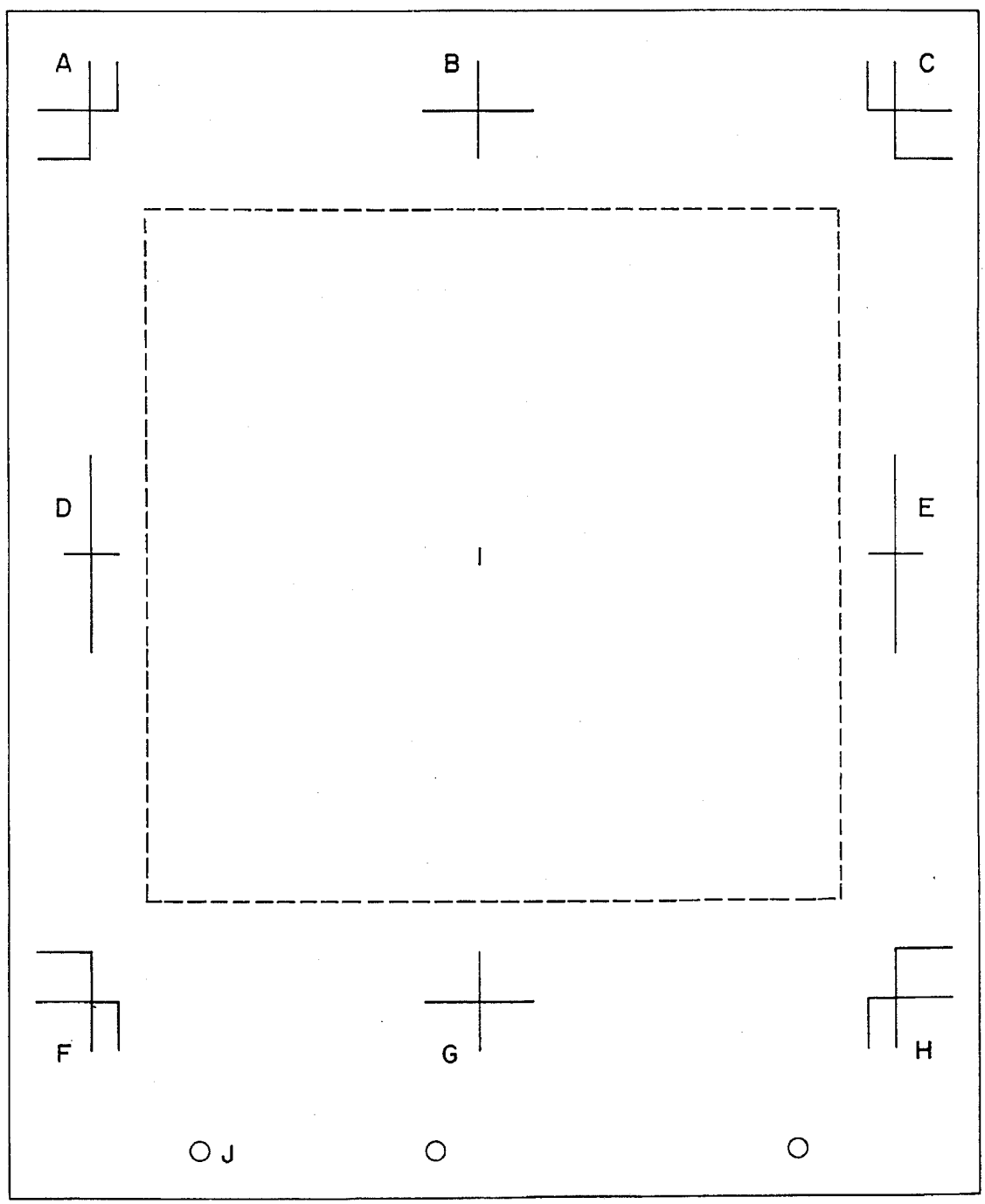
FIG. 1 shows register marks and in FIG. 1 the symbols A–H indicate register marks, I indicates an image portion to be actually printed and J indicates pin holes for using pins for carrying out registration.

The above objects have been attained by the silver halide photographic photosensitive material, characterized in that it comprises a support and, provided thereon, at least one hydrophilic colloid layer including photosensitive layer which comprises monodispersed silver halide grains having an average particle size of 0.2 micron or less and comprising at least 90 mol % of silver chloride, said photosensitive layer or a hydrophilic colloid layer provided on the same side of the support as the side on which the photosensitive layer is provided contains a hydrazine derivative, a hydrophilic colloid layer provided above the photosensitive layer (namely, not between the support and the photosensitive layer) contains a water-dispersible fine particle polymer, said emulsion layer contains substantially no water-dispersible fine particle polymer, and amount of the water-dispersible fine particle polymer contained in the hydrophilic colloid layer is 1 g/m$^2$ or less and is 5% by weight or more based on the weight of gelatin contained in the hydrophilic colloid layer.

One preferred embodiment of the present invention is the above-mentioned silver halide photographic photosensitive material, characterized in that a compound represented by the following formula (I) is contained in a layer provided on the side of the support opposite to the side on which the photosensitive layer is provided.

$$X_1\text{-}SM_1 \qquad (I)$$

(wherein $X_1$ represents a heterocyclic residue to which at least one hydrophilic group is directly or indirectly bonded and M1 represents a hydrogen atom, an alkali metal, a quaternary ammonium or a quaternary phosphonium).

Another preferred embodiment of the present invention is the above-mentioned silver halide photographic photosensitive material, wherein the photosensitive layer and/or other hydrophilic colloid layer additionally contain a water-soluble polymer having an acid group.

Another preferred embodiment of the present invention is the above-mentioned silver halide photographic photosensitive material, wherein the weight ratio of the water-dispersible fine particle polymer/gelatin contained in all of the hydrophilic colloid layers including the photosensitive layer provided on the side of the support on which the photosensitive layer is provided is 0.02–0.2 and the weight ratio of the water-dispersible fine particle polymer/gelatin contained in all of the hydrophilic colloid layers provided on the side of the support opposite to the side on which the photosensitive layer is provided is 0.15–0.6.

Another preferred embodiment of the present invention is the above-mentioned silver halide photographic photosensitive material, wherein the silver halide grains in the photosensitive layer further contains a water-soluble rhodium salt in an amount of $5 \times 10^{-7}$–$2 \times 10^{-4}$ mol based on 1 mol of the silver halide.

A more preferred embodiment of the present invention is the above-mentioned silver halide photographic photosensitive material, wherein the photosensitive layer or other hydrophilic colloid layer further contains a compound represented by the following formula (II), the hydrophilic colloid layer provided above the photosensitive layer (namely, not between the photosensitive layer and the support) contains a matting agent having an average particle size of smaller than 5.5 microns in an amount of 5–50 mg/m² and all of the layers provided on the side of the support on which the photosensitive layer is provided contain substantially no dye which reduces the sensitivity of the photosensitive emulsion.

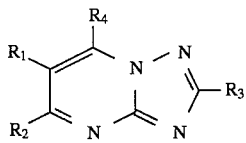

(II)

(wherein $R_1$, $R_2$ and $R_3$ which are identical or different each represent a hydrogen atom, a substituted or unsubstituted alkyl group, a substituted or unsubstituted alkenyl group or an alkylthio group, $R_1$ and $R_2$ may form together a 5- or 6-membered ring and the total number of the carbon atoms of $R_1$ and $R_2$ is 3 or more, and $R_4$ represents a hydroxy group or a mercapto group).

Another preferred embodiment of the present invention is the above-mentioned silver halide photographic photosensitive material, wherein the photosensitive layer or other hydrophilic colloid layer further contains the compound represented by the formula (II) and a compound represented by the following formula (III):

$$Z\text{-}S\text{-}M_2 \quad \text{(III)}$$

(wherein $M_2$ represents a hydrogen atom or a cation and Z represents a heterocyclic residue containing at least one nitrogen atom and the heterocyclic residue may further be condensed).

Another preferred embodiment of the present invention is the above-mentioned silver halide photographic photosensitive material, wherein the photosensitive layer or other hydrophilic colloid layer further contains the compound represented by the formula (II) and a compound represented by the following formula (IV).

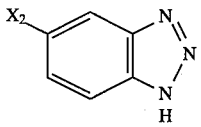

(IV)

(wherein X2 represents a substituent having a Hammett's value σρ of +0.15–+0.70).

A more preferred embodiment of the present invention is the above-mentioned silver halide photographic photosensitive material, wherein the photosensitive layer or other hydrophilic colloid layer further contains a compound represented by the following formula (V):

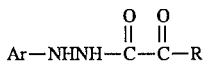

(V)

(wherein Ar represents an aryl group and R represents a group —$OR_5$ or a group —$N(R_6)(R_7)$ in which $R_5$ represents a hydrogen atom, a substituted or unsubstituted alkyl group, a substituted or unsubstituted alkenyl group, a substituted or unsubstituted heterocyclic group or a substituted or unsubstituted aryl group and $R_6$ and $R_7$ each represents a hydrogen atom, a substituted or unsubstituted alkyl group, a substituted or unsubstituted aryl group, a substituted or unsubstituted heterocyclic group or a substituted or unsubstituted pyridinium group and $R_6$ and $R_7$ may link to each other to form a ring).

The water-dispersible fine particle polymers, so-called synthetic polymer latexes, used in the present invention include a wide variety of polymer latexes. Preferred are latexes comprising ethylenically unsaturated monomers, so-called vinyl polymer particles and especially preferred are copolymers of vinyl monomers.

As examples of suitable vinyl monomers, mention may be made of acrylate esters such as methyl acrylate, ethyl acrylate, propyl acrylate, butyl acrylate, t-butyl acrylate, amyl acrylate, hexyl acrylate and octyl acrylate; α-substituted acrylate esters such as methyl methacrylate, ethyl methacrylate, propyl methacrylate, butyl methacrylate and 2-ethylhexylhexyl methacrylate; acrylamides such as butylacrylamides and hexylacrylamide; vinyl esters such as vinyl acetate; vinyl halides such as vinyl chloride; vinylidene halides such as vinylidene chloride; vinyl ethers such as vinylmethyl ether and vinyloctyl ether; styrene; ethylene; butadiene; and acrylonitrile.

Alkyl acrylates and alkyl methacrylates are especially preferred. Especially useful are alkyl acrylate or alkyl methacrylate copolymers containing preferably 30 mol % or less of acrylic acid, methacrylic acid, itaconic acid or a vinyl monomer having a sulfonic acid group. As examples of these copolymers, reference can be made to Japanese Patent Kokoku No. 46-22506 and Japanese Patent Kokai Nos. 56-56227 and 51-59942. The synthetic polymer latexes disclosed in these patent publications can be especially advantageously used. For example, preferable synthetic polymer latexes are butyl acrylate-acrylic acid copolymer, methyl acrylate-acrylic acid copolymer, ethyl acrylate-acrylic acid copolymer, butyl acrylate-itaconic acid copolymer, ethyl acrylate-methacrylic acid copolymer, propyl acrylate-acrylic acid copolymer, butyl acrylate-styrenesulfonic acid copolymer, ethyl acrylate-styrenesulfonic acid copolymer, methyl acrylate-sulfopropyl acrylate copolymer, ethyl acrylate-acrylic acid-2-acetoacetoxyethyl methacrylate copolymer, methyl methacrylate-acrylic acid copolymer and methyl methacrylate-itaconic acid copolymer.

The synthetic polymer latex is used together with a binder such as gelatin which constitutes the photographic layer and in order to exhibit the effects of the present invention, it is preferred that the hydrophilic colloid layer provided above the photosensitive layer (namely, not between the support and the photosensitive layer) contains the polymer latex and the photosensitive emulsion layer contains substantially no polymer latex, and content (in terms of solid content) of the polymer latex in the hydrophilic layer is 1 g/m² or less and is 5% by weight or more based on the weight of gelatin contained in the hydrophilic colloid layer. That the emulsion layer contains substantially no polymer latex means that the layer does not contain the polymer latex in such an amount as affecting the film properties or photographic characteristics and specifically means that amount of the polymer latex in the emulsion layer is less than 1% by weight of the gelatin contained in the emulsion layer.

The technique of adding the polymer latex to the silver halide photographic photosensitive materials containing a hydrazine derivative is described in Japanese Patent Kokai Nos. 2-41, 2-1834, 4-51142 and 4-106542 (hereiafter referred to as A, B, C and D, resepctively). Among them, A, B and D show examples of adding a polymer latex for inhibiting occurrence of black spots peculiar to the photosensitive materials containing a hydrazine derivative. In all of working examples of them, the polymer latex was added to the emulsion layer and as is clear therefrom, it is suitable for exhibiting the inhibitory effect at maximum to add the polymer latex to the emulsion layer. The patent publication C shows improvement of matting property by using a polymer latex and a matting agent in combination and in this case, the polymer latex was also added to the emulsion layer in the working examples.

On the other hand, the inventors have found that when the polymer latex is contained in a hydrophilic colloid layer provided above the photosensitive layer, namely, not between the photosensitive emulsion layer and the support of silver halide photographic photosensitive materials containing a hydrazine derivative and besides substantially no polymer latex is contained in the emulsion layer, dissolution of silver halide into the developer can be inhibited to diminish stain with silver of a developing tank and a developing rack of automatic developing machines and photosensitive materials processed therein without damaging the high contrast and other effects provided by the hydrazine derivatives. On the other hand, when the polymer latex is added to the emulsion layer as shown in the above patent publications, there is exhibited no effect to inhibit the dissolution of silver halide into the developer to diminish stain with silver and rather the effect of the hydrazine derivative to afford the high contrast is damaged to lose the meaning to add the hydrazine derivative. That is, the technique claimed in the present invention utterly differs from the above patent publications in the object and the effects and in addition, in the mode of using the polymer latex and thus, is novel and unexpectable from the prior art.

More preferred embodiment of the present invention to attain the above objects is to satisfy the following conditions in addition to the above-mentioned conditions, namely, that the ratio of the total amount of the polymer latex and the total amount of the gelatin contained in all of the hydrophilic colloid layers provided on the side of the support on which the photosensitive layer is provided is 0.02–0.2 (the photosensitive layer does not contain the polymer latex as mentioned above) and that the ratio of the total amount of the polymer latex and the total amount of the gelatin contained in all of the hydrophilic colloid layers provided on the side of the support opposite to the side on which the photosensitive layer is provided is 0.15–0.6.

One or more kinds of the polymer latexes can be used. They may be mixtures of two or more. Furthermore, different kinds of the polymer latexes may be used on the respective sides of the support.

Amount of the gelatin in the respective layers which constitute the photosensitive materials of the present invention is the amount which is a basis for specifying the amount of the polymer latex and this is determined depending on the performances to be imparted to the photosensitive materials, properties of processing solution and drying ability of the automatic developing machine used in combination. Thus, the amount cannot be generically specified, but the following amount can be employed as a standard: that is, an amount of 1–10 g/m$^2$, preferably 1.5–6 g/m$^2$ on the side of the support on which the photosensitive layer is provided and an amount of 0.5–8 g/m$^2$, preferably 1–8 g/m$^2$ on the side of the support opposite to the side on which the photosensitive layer is provided.

Next, the compound represented by the formula (I) will be explained in detail. As examples of the heterocyclic residue represented by $X_1$, mention may be made of oxazole ring, thiazole ring, imidazole ring, selenazole ring, triazole ring, tetrazole ring, thiadiazole ring, oxadiazole ring, pentazole ring, pyrimidine ring, thiazia ring, triazine ring and thiadiazine ring, and besides, those which bond to other carbon rings or hetero rings, such as benzoxazole ring, benzothiazole ring, benzimidazole ring, benzoselenazole ring, benzotriazole ring and naphthoxazole ring.

Examples of the hydrophilic groups which bond to the heterocyclic residues are —$SO_3M_3$, —$SO_2NHR_8$, —NHCONHR$_8$, —NHSO$_2$R$_8$, —COONHR$_8$, —NHCOR$_8$, —PO$_3$M$_3$, —COOM$_3$ and —OH wherein R$_8$ represents a hydrogen atom or an alkyl group of 1–5 carbon atoms and M$_3$ represents a hydrogen atom, an alkali metal, a quaternary ammonium or a quaternary phosphonium.

Examples of the compounds represented by the formula (I) are shown below, but the present invention is not limited to the use of these compounds.

(I-1)

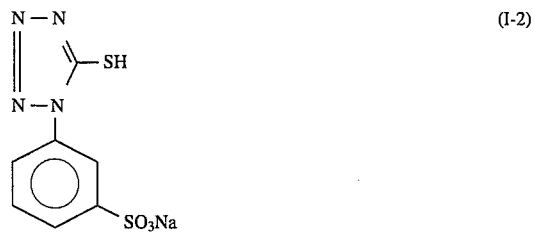

(I-2)

(I-3)

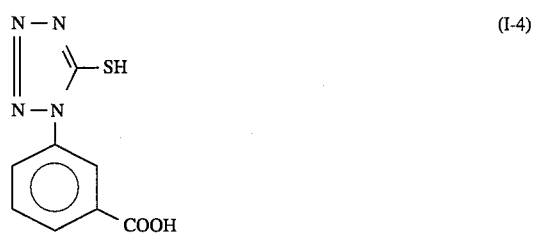

(I-4)

-continued
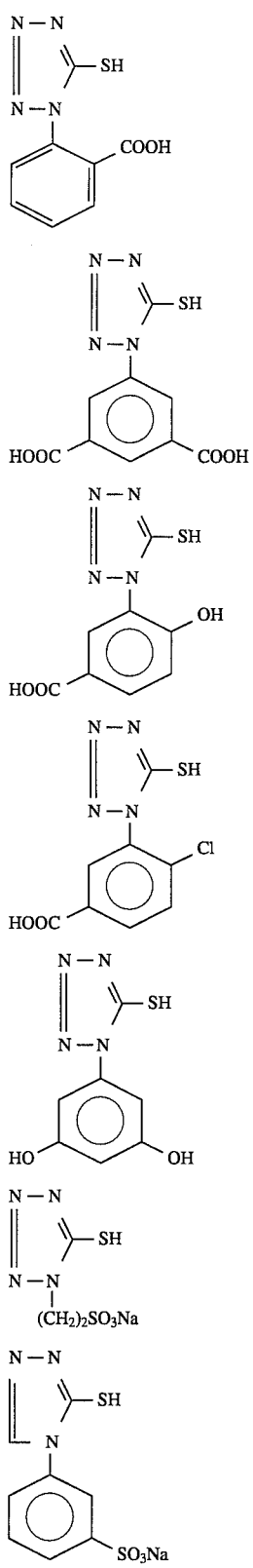
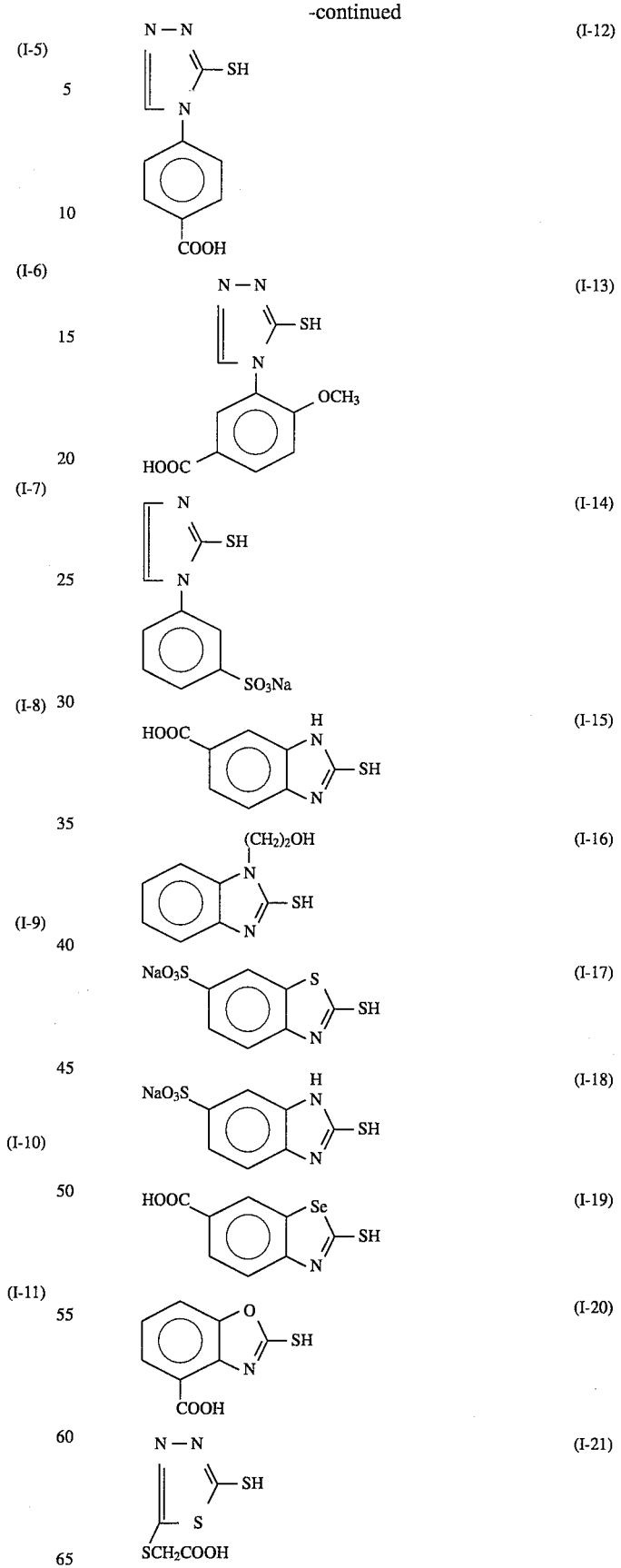

-continued

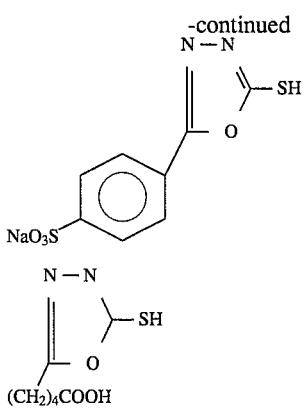
(I-22)

(I-23)

The amount of the compound represented by the formula (I) which is contained in the layer provided on the side of the support opposite to the side on which the photosensitive layer is provided may vary depending on the size of silver halide grains in the photosensitive layer, composition of halogen, kind or amount of the binder and other conditions, but is preferably determined depending on the amount of the silver halide in the photosensitive layer. That is, the amount of the compound is practically preferably in the range of $1 \times ^{-5}$–$1 \times 10^{-1}$ mol, more preferably $1 \times 10^{-4}$–$5 \times 10^{-2}$ mol based on 1 mol of the silver halide in the photosensitive layer.

Next, the polymer having an acid group will be explained below. The water-soluble polymers having an acid group represent polymers containing an acidic group having a pKa value of 9 or less. Preferred are polymers having a sulfonic acid group or a carboxylic acid group. The most preferred are polymers or copolymers of acrylic acid, maleic acid or styrenesulfonic acid.

Amount of the water-soluble polymer having acid group depends on the kind and the amount of the hydrazine derivative constituting the photosensitive material, but is preferably 0.1 mg–1 g/m$^2$, especially preferably 1–100 mg/m$^2$. The water-soluble polymer can be added to any of the constituting layers of the photosensitive material of the present invention. It can be contained in a plurality of the layers.

The matting agent used in more preferred embodiment of the roomlight photosensitive material of the present invention has an average particle size of smaller than 5.5 microns, preferably at least 1 micron and smaller than 5.5 microns. Materials of the matting agent such as silica type and polymer type are unlimited. Moreover, particle size distribution may be either uniform or scattering, but it is preferred that the number of particles of extremely large size, specifically particles of larger than 10 microns do not exceed 10% of the total number of the particles. The particles may be of either regular or irregular form and when the particles are not spherical, the particle size is expressed by the diameter of a sphere to which the particle is converted based on the volume of the particle.

Amount of the matting agent is 5–50 mg/m$^2$ and one or two or more kinds of the matting agents may be used. The matting agent can be added by any methods, but preferably it is uniformly dispersed in a suitable solvent such as water, methanol or the like and the dispersion is added to a coating solution. The matting agent is added to the layers provided above the photosensitive layer, namely, not to the layer provided between the support and the photosensitive layer. It may be divided and added to a plurality of the layers. Most preferably, it is added to the outermost layer.

The compound represented by the formula (II) will be explained in detail. The compound represented by the formula (II) is a 4-hydroxy or 4-mercapto-1,3,3a,7-tetrazaindene in which the sum of carbon atoms of the substituents attached to 5- and 6-positions is 3 or more.

Examples of the compound represented by the formula (II) are shown below. The present invention is not limited to these compounds.

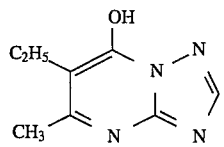
(II-1)

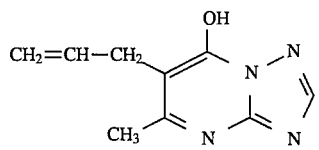
(II-2)

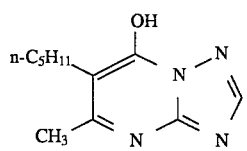
(II-3)

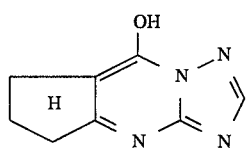
(II-4)

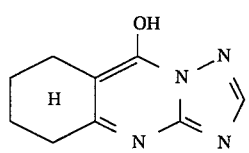
(II-5)

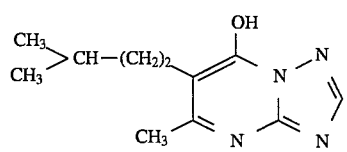
(II-6)

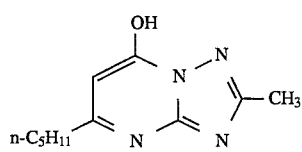
(II-7)

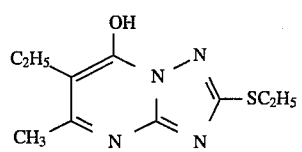
(II-8)

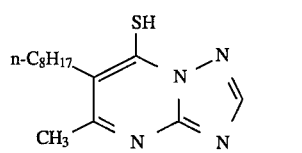
(II-9)

The compound represented by the formula (II) is preferably added to the silver halide emulsion layer, but may be added to other hydrophilic colloid layers. Content of the compound in the layer varies depending on the characteristics of the silver halide emulsion layer used, the chemical structure of the compound and the developing conditions and can vary in a wide range, but a range of about 6×10$^-$ $6-6\times10^{-2}$ mol per 1 mol of silver in the silver halide emulsion is practically advantageous and a range of about $2\times10^{-4}-4\times10^{-2}$ mol per 1 mol of silver in the silver halide emulsion is more preferred.

It is known for one skilled in the art to add a tetrazaindene compound to silver halide photographic photosensitive materials as described, for example, in "Shashin no Kagaku (Photographic Chemistry)" (published from Shashin Kogyo Shuppan Sha). Furthermore, it is disclosed in Japanese Patent Kokai Nos.53-84714 and 64-65541 to add a hydroxytetrazaindene compound to a silver halide photographic emulsion containing a hydrazine compound. However, all of them show the effects different from those of the present invention. In addition, the effects of the present invention cannot be obtained by the use of 4-hydroxy-6-methyl-1,3,3a,7-tetrazaindene which is very generally used in the field of photographic industry. That is, the effects of the present invention are developed only with a very specific tetrazaindene compound and are utterly novel effects unexpectable from conventional techniques.

Next, the compound represented by the formula (III) will be explained in detail. In the formula (III), $M_2$ represents a hydrogen atom or a cation such as an alkali metal ion, ammonium ion or the like, and the heterocyclic residue represented by Z may be further condensed. Preferred examples are imidazole, triazole, tetrazole, thiazole, oxazole, selenazole, benzimidazole, benzoxazole, benzothiazole, thiadiazole, oxadiazole, benzoselenazole and azaindenes such as triazaindene, tetrazaindene and pentazaindene.

Furthermore, these heterocyclic residues and condensed rings may be substituted with suitable substituents. Examples of the substituents are alkyl groups such as methyl group, ethyl group and hydroxyethyl group, alkenyl groups such as allyl group, aralkyl groups such as benzyl group, aryl groups such as phenyl group and naphthyl group, heterocyclic residues such as pyridine group, halogen atoms, mercapto group, cyano group, carboxyl group, sulfo group, hydroxy group, amino group, nitro group, and alkoxy groups such as methoxy group.

Examples of the compound represented by the formula (III) are shown below. The present invention is not limited by these compounds.

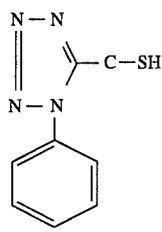
(III-1)

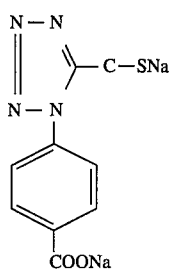
(III-2)

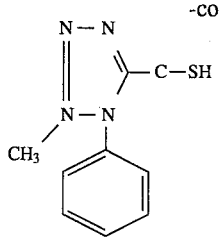
(III-3)

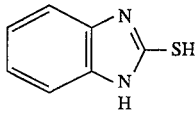
(III-4)

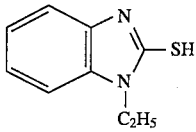
(III-5)

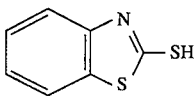
(III-6)

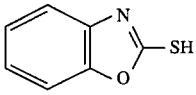
(III-7)

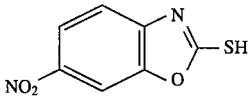
(III-8)

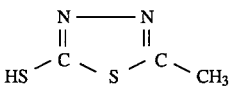
(III-9)

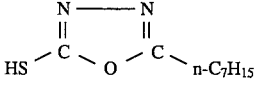
(III-10)

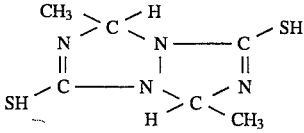
(III-11)

The compound represented by the formula (III) is preferably added to the silver halide emulsion layer, but may be added to other hydrophilic colloid layers. Content of the compound in the layer varies depending on the characteristics of the silver halide emulsion layer used, the chemical structure of the compound and the developing conditions and can vary in a wide range, but a range of about $5\times10^{-6}-5\times10^{-2}$ mol per 1 mol of silver in the silver halide emulsion is practically advantageous and a range of about $1\times10^{-4}-3\times10^{-2}$ mol is more preferred.

Next, the compound represented by the formula (IV) will be explained in detail. The compound represented by the formula (IV) is a benzotriazole compound having a substituent having a Hammett's value σp of +0.15–+0.70. The Hammett's value σp is one parameter which can be used as a measure for electron donating property or electron attracting property of substituent and is known, for example, in "Advanced Organic Chemistry", 3rd edition, part 2 (1990), Plenum. New York, page 201.

As examples of the substituent corresponding to $X_2$ in the formula (IV), mention may be made of chlorine atom ($\sigma p$=0.24), bromine atom ($\sigma p$=0.26), fluorine atom ($\sigma p$=0.15), acetyl group ($\sigma p$=0.47), carboxyl group ($\sigma p$=0.44), methoxycarbonyl group ($\sigma p$=0.44) and cyano group ($\sigma p$=0.70), and benzotriazole compounds having a substituent such as hydrogen atom ($\sigma p$=0), methyl group ($\sigma p$=−0.14) and nitro group ($\sigma p$=0.81) are not included.

Examples of the compound represented by the formula (IV) are shown below. The present invention is not limited by these compounds.

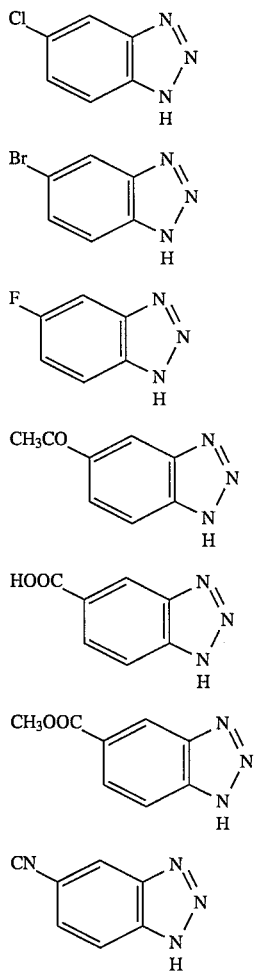

The compound represented by the formula (IV) is preferably added to the silver halide emulsion layer in the roomlight photosensitive materials of the present invention, but may be added to other hydrophilic colloid layers. Content of the compound in the layer varies depending on the characteristics of the silver halide emulsion used, the chemical structure of the compound and the developing conditions and can vary in a wide range, but a range of about $5\times10^{-6}$–$5\times10^{-2}$ mol per 1 mol of silver in the silver halide emulsion is practically useful and a range of about $1\times10^{-4}$–$3\times10^{-2}$ mol is more preferred.

It is known for one skilled in the art to add a tetrazaindene compound to silver halide photographic photosensitive materials as mentioned, for example, in "Shashin no Kagaku (Photographic Chemistry)" (published from Shashin Kogyo Shuppan Sha). Furthermore, it is disclosed in Japanese Patent Kokai Nos.53-84714 and 64-65541 to add a hydroxytetrazaindene compound to a silver halide photographic emulsion containing a hydrazine compound. However, all of them show the effects different from those of the present invention. In addition, the effects of the present invention cannot be obtained by the use of 4-hydroxy-6-methyl-1,3 3,3a,7-tetrazaindene which is very generally used in the field of photographic industry and the present invention is limited to use of the specific tetrazaindene compound represented by the formula (II).

A part of the objects of the present invention, namely, a photosensitive material which is excellent in vaccum performance, produces few pinholes and can provide images of high sharpness can be realized for the first time by the combination of the matting agent of a specific size in a limited amount with the tetrazaindene compound represented by the formula (II) and can never be expected from conventional art.

Furthermore, Japanese Patent Kokai Nos. 60-153039 and 63-103232 disclose to add compounds having mercapto group to silver halide photographic photosensitive materials containing hydrazine compounds. However, in these techniques, the compounds having mercapto group act as organic antifoggants and there are problems in safety against a white fluorescent lamp from which ultraviolet ray has been removed and which is used as a safety light for roomlight photosensitive materials.

That is, the roomlight silver halide photographic photosensitive material which is less in increase of sensitivity and formation of pepper fog even if processed with a developer increased in activity due to exhaustion with lapse of time and can be handled under roomlight for a long time and which is a part of the objects of the present invention can be realized for the first time by the combination of the compound having mercapto group represented by the formula (III) with the specific tetrazaindene compound represented by the formula (II) and can never be expected from conventional techniques.

Furthermore, Japanese Patent Kokai Nos. 53-66732 and 61-615752 disclose to add benzotriazole compounds to silver halide photographic photosensitive materials containing hydrazine compounds. However, in these techniques, the benzotriazole compounds act as organic antifoggants and the similar effects have been obtained with most of the benzotriazole compounds. On the other hand, the effects of the present invention cannot be obtained with benzotriazole, 5-methylbenzotriazole and 5-nitrobenzotriazole which are generally employed in the photographic industry and the present invention is limited to the use of the specific benzotriazole compound represented by the formula (IV).

That is, the roomlight silver halide photographic photosensitive material which is less in occurrence of uneven development and in formation of pepper fog and can be handled under roomlight for a long time and which is a part of the objects of the present invention can be realized for the first time by the combination of the specific benzotriazole compound represented by the formula (IV) with the specific tetrazaindene compound represented by the formula (II) and can never be expected from conventional techniques.

Next, the compound represented by the formula (V) will be explained in detail. The aryl group represented by Ar is specifically a phenyl or naphthyl group which may have a substituent. As examples of the substituent, mention may be made of alkyl group, aryl group, hydroxyl group, halogen atom, alkoxy group, alkylthio group, aryloxy group, alkenyl group, amino group, acylamino group, sulfonamide group, alkylideneamino group, ureido group, thiourea group, thioamide group and heterocyclic group and combinations thereof.

Furthermore, Ar may contain a ballast group which is practically used in immobilizing photographic additives such as color couplers. The ballast group is a photographically relatively inert group having at least 8 carbon atoms and can be selected, for example, from alkyl group, alkoxy group, phenyl group, phenoxy group and the like.

R in the formula (V) represents a group represented by —OR$_5$ or —N(R$_6$)(R$_7$).

R$_5$ represents a hydrogen atom, a substituted or unsubstituted alkyl group, a substituted or unsubstituted alkenyl group, a substituted or unsubstituted heterocyclic group or a substituted or unsubstituted aryl group. R$_6$ and R$_7$ each represents a hydrogen atom, a substituted or unsubstituted alkyl group, a substituted or unsubstituted aryl group, a substituted or unsubstituted heterocyclic group or a pyridinium group represented by the following formula (A). Furthermore, R$_6$ and R$_7$ may link to each other to form a ring.

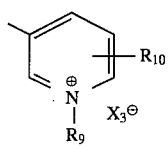

(A)

(wherein R$_9$ represents a substituted or unsubstituted alkyl group, a substituted or unsubstituted aralkyl group or a substituted or unsubstituted alkenyl group, R$_{10}$ represents a hydrogen atom, a substituted or unsubstituted alkyl group, a substituted or unsubstituted aryl group or a substituted or unsubstituted alkoxy group and X$_3$ represents an anion).

Examples of the compound represented by the formula (V) are shown below. The present invention is not limited by these compounds.

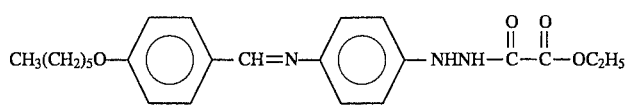
(V-1)

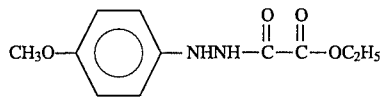
(V-2)

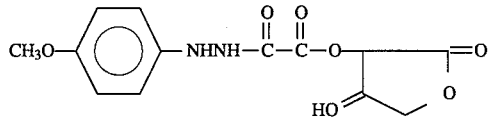
(V-3)

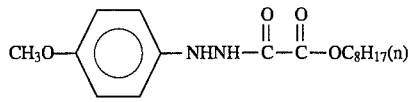
(V-4)

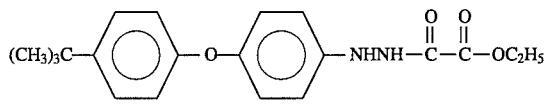
(V-5)

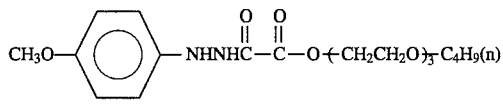
(V-6)

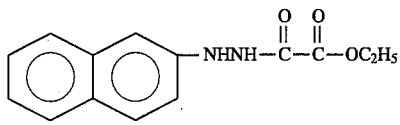
(V-7)

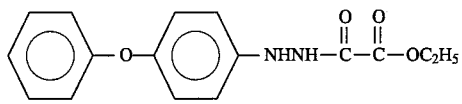
(V-8)

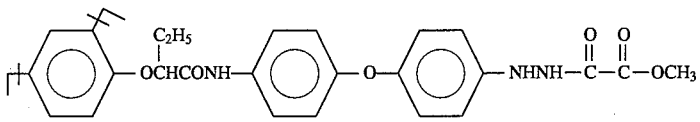
(V-9)

-continued
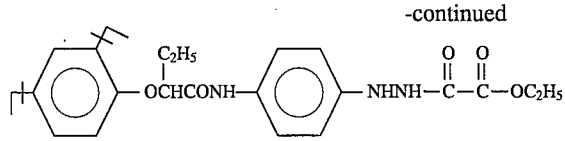
(V-10)
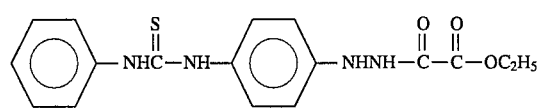
(V-11)
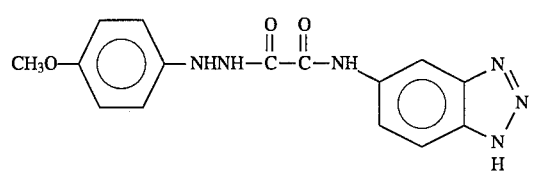
(V-12)
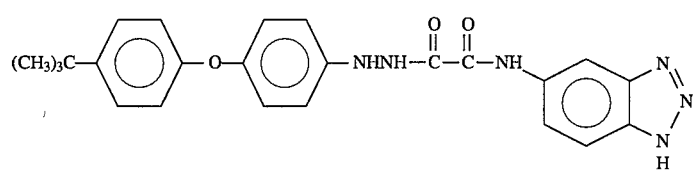
(V-13)
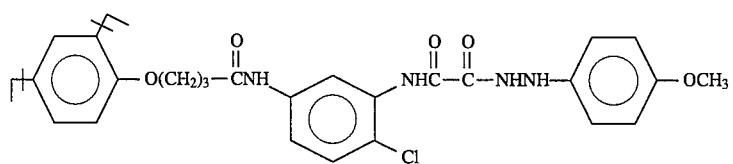
(V-14)
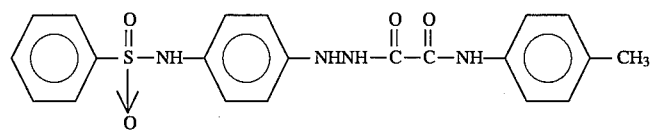
(V-15)
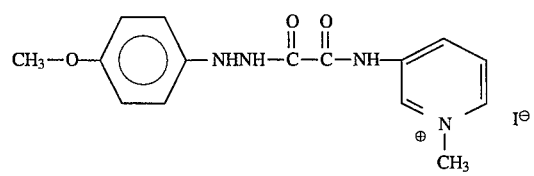
(V-16)
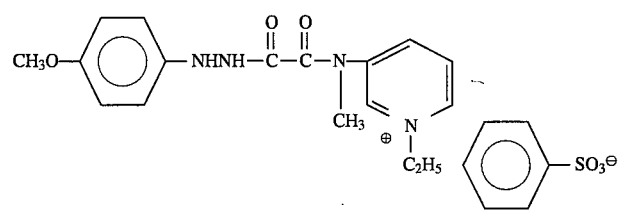
(V-17)
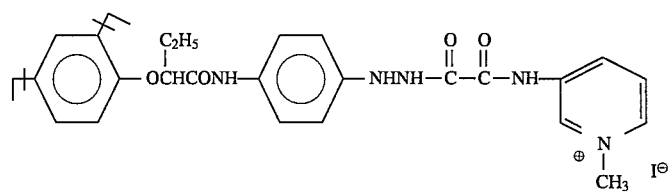
(V-18)

-continued
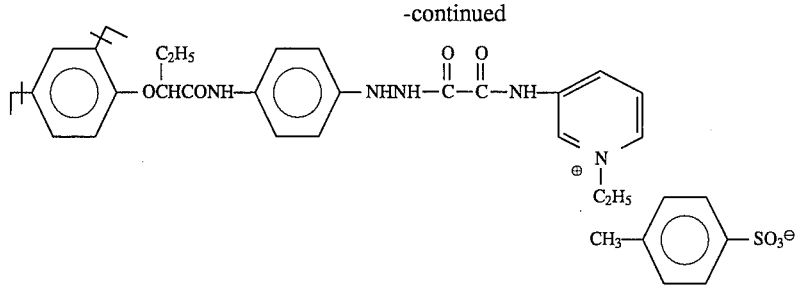
(V-19)
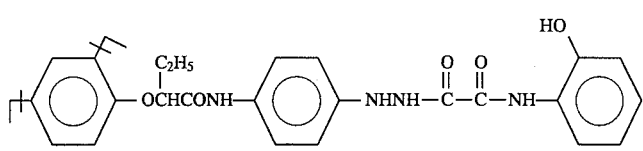
(V-20)
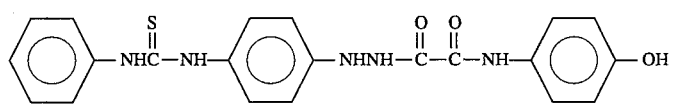
(V-21)
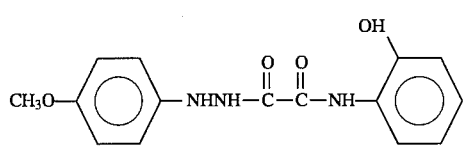
(V-22)
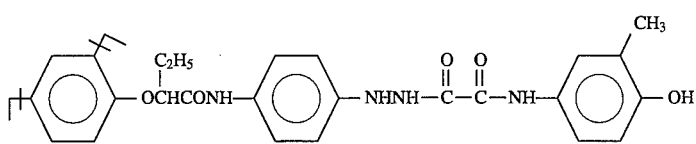
(V-23)
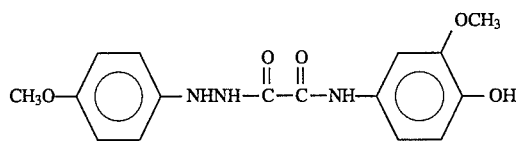
(V-24)
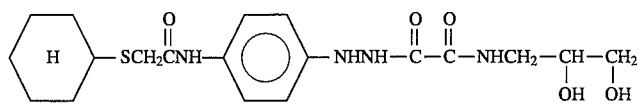
(V-25)
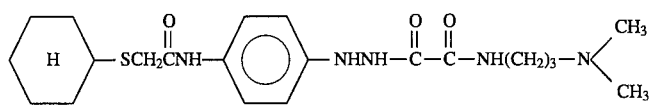
(V-26)
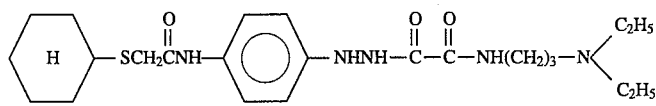
(V-27)
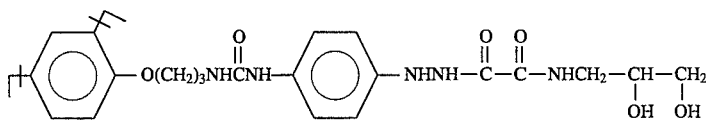
(V-28)
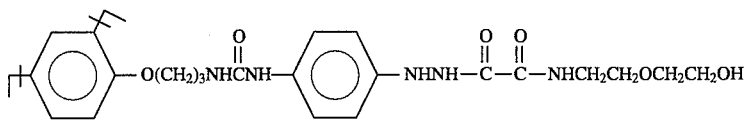
(V-29)

-continued

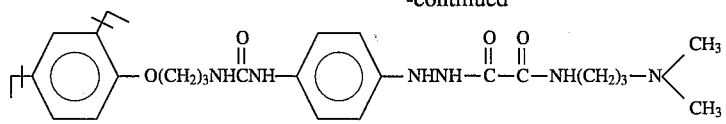
(V-30)

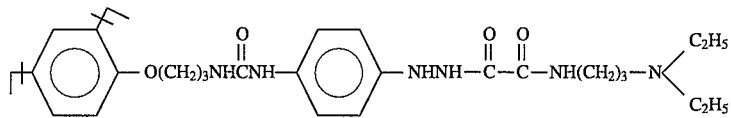
(V-31)

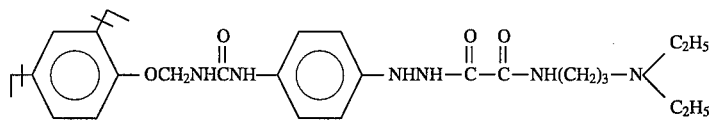
(V-32)

In the present invention, the hydrazine derivative is preferably added to the silver halide emulsion layer, but may be added to other hydrophilic colloid layers. Content of the hydrazine derivative in the layer varies depending on the characteristics of the silver halide emulsion used, the chemical structure of the compound and the developing conditions and can vary in a wide range, but a range of about $5 \times 10^{-6}$–$8 \times 10^{-2}$ mol per 1 mol of silver in the silver halide emulsion is practically useful and a range of about $5 \times 10^{-5}$–$1 \times 10^{-2}$ mol is more preferred.

As examples of the silver halde used in the photosensitive silver halide emulsion layer of the photosensitive materials of the present invention, mention may be made of silver chloride or silver chlorobromide, silver chlorobromoiodide or silver chloroiodide which contains at least 90 mol % of silver chloride. Preferred are silver chloride, silver chlorobromide containing 5 mol % or less of silver bromide and silver chloroiodide containing 1 mol % or less of silver iodide. Form and crystal habit of the silver halide grains are not limitative, but the silver halide grains which can be used in the present invention have an average grain size of 0.2 micron or smaller and are in the form of monodispersion. The monodispersed emulsion herein means an emulsion in which 90% or more of total grains have a size within ±10% of the average grain size. The silver halide emulsion may be prepared by any known methods such as regular mixing, reverse mixing and simultaneous mixing.

The water-soluble rhodium salts contained in the silver halide grains in the photosensitive silver halide emulsion layer of the roomlight photosensitive materials of the present invention may be conventionally used ones. Representative examples of the rhodium salts are rhodium monochloride, rhodium dichloride, rhodium trichloride and rhodium ammonium chloride. The water-soluble rhodium salts are preferably used at the time of precipitation or physical ripening of silver halide, but may also be used at any stages thereafter. Amount of the water-soluble rhodium salts is in the range of $5 \times 10^{-7}$–$2 \times 10^{-4}$ mol per 1 mol of silver halide, preferably in the range of $1 \times 10^{-6}$–$1 \times 10^{-4}$ mol per 1 mol of silver halide.

Furthermore, salts of noble metals such as iridium salts or iron compounds such as potassium ferricyanide can be allowed to be present together with the rhodium salt at the time of physical ripening or nucleation of silver halide grains.

It is preferred that the emulsion after subjected to physical ripening is desalted and then coated after addition of necessary additives, but the desalting treatment may be omitted.

It is advantageous to use gelatin as the binder or protective colloid usable in the emulsion layer, overcoat layer, intermediate layer, backcoat layer or the like of the photosensitive materials of the present invention, but other hydrophilic colloids may also be used. For example, there may be used proteins such as gelatin derivatives, graft polymers of gelatin with other polymers, albumin and casein; cellulose derivatives such as hydroxyethylcellulose, carboxy-methylcellulose and cellulose sulfate ester; sugar derivatives such as sodium alginate and starch derivatives; and various synthetic hydrophilic polymer materials such as homopolymers or copolymers, e.g., polyvinyl alcohol, partial acetal of polyvinyl alcohol, poly-N-vinylpyrrolidone, polyacrylic acid, poly-methacrylic acid, polyacrylamide and polyvinylimidazole. As gelatins, in addition to lime-treated gelatin, there may be used acid-treated gelatin or enzyme-treated gelatin as described in "Bull. Soc. Sci. Phot. Japan", No. 16, p 30 (1966) and furthermore, hydrolyzates or enzyme-decomposition products of gelatin may also be used.

Various compounds can be contained in the photographic emulsion used in the present invention for the purposes of inhibiting the formation of fog during preparation, storage or photographic processing of the photosensitive materials and stabilizing the photographic performances. The photographic photosensitive material of the present invention may contain inorganic or organic hardeners in the photographic emulsion layer and other hydrophilic colloid layers. For example, chromium salts such as chrome alum, aldehydes such as formaldehyde and glyoxal, N-methylol compounds, dioxane derivatives such as 2,3-dihydroxydioxane, active vinyl compounds and active halogen compounds such as 2,4-dichloro-6-hydroxy-S-triazine may be used each alone or in combination.

Moreover, dyes known to one skilled in the art can be contained in the backing layer of the photographic photosensitive material for inhibiting degradation of image quality caused by halation. As specified in the more preferred embodiment of the present invention, any layers on the side of the support on which the emulsion layer is provided preferably contain substantially no dye which reduces the sensitivity of the photosensitive emulsion. The dye here includes all dyes known to one skilled in the art as those used for inhibition of irradiation. "The layer contains substantially no dye" means that the layer does not contain the dye in such an amount that it damages the effect of the invention and the layer can contain the dye in such a slight amount as not damaging the effect. The slight amount varies depending on spectral absorption or molecular extinction coefficient of the dye, but the dye can be contained in an amount of at most 10 mg/m$^2$.

Furthermore, the photographic emulsion layer or other hydrophilic colloid layers of the photosensitive materials of the present invention may contain surface active agents for various purposes such as coating aid, antistatic treatment, improvement of slipperiness and emulsion dispersibility, inhibition of sticking and improvement of photographic characteristics (acceleration of development, high contrast and sensitization). Examples are nonionic surface active agents such as saponin (steroid type), alkylene oxide derivatives, e.g., polyethylene glycol and polyethylene glycol alkyl ethers, glycidol derivatives, e.g., polyglyceride alkenylsuccinate, fatty acid esters of polyhydric alcohols and alkyl esters of sugars; anionic surface active agents containing acidic group such as carboxyl group, sulfo group, phospho group, sulfate ester group or phosphate ester group, e.g., alkyl-carboxylate salts, alkylsulfate salts and alkylphosphate esters; amphoteric surface active agents such as amino acids, aminoalkylsulfonic acids, aminoalkylsulfate esters and aminoalkylphosphate esters; and cationic surface active agents such as aliphatic or aromatic quaternary ammonium salts and heterocyclic quaternary ammonium salts, e.g., pyridinium and imidazolium.

Any supports known to one skilled in the art can be used for the photographic photosensitive materials of the present invention. The supports include, for example, glass, cellulose acetate film, polyethylene terephthalate film, paper, baryta-coated paper, polyolefin (e.g., polyethylene and polypropylene)-laminated paper, polystyrene film, polycarbonate film and metal plates such as aluminum. These supports may be subjected to corona treatment by known methods and furthermore, if necessary, they may be subjected to subbing treatment by known methods.

In order to obtain photographic characteristic of ultra-high contrast in the silver halide photosensitive materials of the present invention, it is not necessary to use the conventional lith developer or the high alkali developer having a pH close to 13 described in U.S. Pat. No. 2,419,975, and a stable developer can be used. That is, for the silver halide photographic photosensitive materials of the present invention, a developer containing sulfite ion as a preservative in a sufficient amount (especially, at least 0.15 mol/l) can be used and furthermore, a negative image of sufficiently ultra-high contrast can be obtained by using a developer having a pH of 9.5 or more, especially 10.5–12.3. The developing agent is not limitative and dihydroxybenzenes, 3-pyrazolidones, aminophenols and the like can be used each alone or in combination. The developer may further contain pH buffers such as sulfites, carbonates, borates and phosphates of alkali metals, and development restrainers or antifoggants such as bromides, iodides and organic antifoggants (especially preferably nitroindazoles or benzotriazoles). Furthermore, if necessary, the developer may contain hard water softener, dissolving aid, toning agent, development accelerator, surface active agent, antifoamer, hardener and silver staining inhibitor for films. Examples of these additives are described in "Research Disclosure", No 176, 17643 and others In order to obtain photographic characteristics of especially ultra-high contrast, amine compounds described in Japanese Patent Kokai Nos. 56-106244, 61-267759, 61-230145, 62-211647, 2-50150, 2-208652 and others can be added to the developer. Typical examples of the amine compounds are enumerated below.

A-1) N-n-butyldiethanolamine
A-2) 3-Diethylamino-1,3 2-propanediol
A-3) 2-Diethylamino-1-ethanol
A-4) 2-Diethylamino-1-butanol
A-5) 3-Diethylamino-1,3 2-propanediol
A-6) 3-Diethylamino-1-propanol
A-7) Triethanolamine
A-8) 3-Dipropylamino-1,2-propanediol
A-9) 2-Dioctylamino-1-ethanol
A-10) 3-Amino-1,2-propanediol
A-11) 1-Diethylamino-2-propanol
A-12) n-Propyldiethanolamine
A-13) 2-Di-isopropylaminoethanol
A-14) N,N-di-n-butylethanolamine
A-15) 3-Di-propylamino-1,2-propanediol
A-16) 2-Methylamino-1-ethanol
A-17) 3-Diethylamino-1,2-propanediol
A-18) 4-Diethylamino-1-butanol
A-19) 1-Diethylamino-2-butanol
A-20) 1-Diethylamino-2-hexanol
A-21) 5-Diethylamino-1-pentanol
A-22) 6-Diethylamino-1-hexanol
A-23) 1-Diethylamino-2-octanol
A-24) 6-Diethylamino-1,2-hexanediol Amount of the amine compound may be such that can accelerate enhancement of contrast, but is generally 0.005–1.0 mol/l.

In the present invention, there may be employed such method according to which the developing agent is contained in the photosensitive material and the photosensitive material is processed with an alkaline activator solution (Japanese Patent Kokai Nos. 57-129436, 57-129433, 57-129434, 57-129435 and U.S. Pat. No. 4,323,643). The processing temperature is usually selected from the range of from 18° C. to 50° C., but may be lower than 18° C. or higher than 50° C. An automatic developing machine is preferably used for photographic processing. In the present invention, even when the total processing time from the photosensitive material entering the automatic developing machine to the photosensitive material coming out of the developing machine is set at 60–120 seconds, photographic characteristics of negative gradation of sufficiently ultra-high contrast.

The following nonlimiting examples illustrate the present invention.

Example 1

To a gelatin solution were added 200 mg/m$^2$ of Oxonol Yellow manufactured by Hoechst Co., a surface active agent and a matting agent and additionally a hardener. This gelatin solution was coated on a polyethylene terephthalate film at a coating amount of 3 g/m$^2$ in terms of gelatin to form a backcoat layer.

A gelatino silver chloride emulsion comprising cubic crystals of 0.13 micron in average grain size and containing 6.4×10$^{-6}$ mol/mol Ag of rhodium dichloride was prepared by double jet method. This emulsion was subjected to desalting by flocculation method, washing with water and redissolution. To this emulsion were added 2×10$^{-3}$ mol/mol Ag of the hydrazine derivative shown by the formula V-27 exemplified hereabove, 4×10$^{-3}$ mol/mol Ag of the benzotriazole compound shown by the formula IV-1 exemplifed hereabove, 6×10$^{-3}$ mol/mol Ag of the tetrazaindene compound shown by the formula II-3 exemplified hereabove, 4×10$^{-3}$ mol/mol Ag of the compound shown by the formula III-1 exemplified hereabove, 2-hydroxy-4,6-dichloro-1,3,5-triazine sodium salt and the surface active agent shown by the following formula (B). Then, the emulsion was coated on another side of the backcoated film at a coating amount of 5 g/m$^2$ in terms of silver nitrate and 3 g/m$^2$ in terms of gelatin.

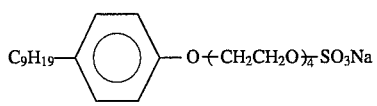
(B)

A coating solution containing 1 g/m² of gelatin, a surface active agent, a hardener, a matting agent and one of the following seven polymer latexes A-G was coated on the emulsion layer as a protective layer to obtain the samples as shown in Table 1. As comparative examples, a sample containing no polymer latex, a sample containing the polymer latex in the emulsion layer and a sample containing the polymer latex in both the overcoating protective layer and the emulsion layer were also prepared.

A: Ethyl acrylate-acrylic acid copolymer (acrylic acid 5 mol %)

B: Butyl acrylate-acrylic acid copolymer (acrylic acid 10 mol %)

C: Ethyl acrylate-styrenesulfonic acid copolymer (styrenesulfonic acid 4 mol %)

D: Butyl acrylate-itaconic acid copolymer (itaconic acid 5 mol %)

E: Ethyl acrylate-methacrylic acid copolymer (methacrylic acid 3 mol %)

F: Methyl methacrylate-acrylic acid copolymer (acrylic acid 10 mol %)

G: Methyl methacrylate-butyl acrylate-acrylic acid copolymer (acrylic acid 10 mol %)

These films were exposed through a sensitometric wedge by a roomlight printer (P-627FM manufactured by Dainippon Screen Mfg. Co., Ltd.) and developed with a developer having the following composition at 38° C. for 20 seconds, followed by fixing, washing with water and drying. For this processing, an automatic developing machine (LD-221QT manufactured by Dainippon Screen Mfg. Co., Ltd.) was used, and sensitivity and gamma were measured. The sensitivity is relatively expressed assuming the sensitivity of the comparative sample containing no latex to be 100. The gamma was measured by tanθ at the linear part of the optical density of 1.0–2.5.

| Developer: | |
|---|---|
| Hydroquinone | 50.0 g |
| N-methyl-p-aminophenol ½ H₂SO₄ | 0.3 g |
| Sodium hydroxide | 18.0 g |
| 5-Sulfosalicylic acid | 55.0 g |
| Potassium sulfite | 110.0 g |
| EDTA.2Na | 1.0 g |
| Potassium bromide | 10.0 g |
| 5-Methylbenzotriazole | 0.4 g |
| 2-Mercaptobenzimidazole-5-sulfonic acid | 0.2 g |
| Sodium 3-(5-mercaptotetrazole)benzenesulfonate | 0.2 g |
| N-n-butyldiethanolamine | 12.0 g |
| Sodium toluenesulfonate | 8.0 g |
| Water to make up totally one liter | |

The developer was adjusted to pH 11.8 with potassium hydroxide.

Separately, each of the films were processed with the same developer as above up to 0.6 m² per 1 liter of the developer by the same automatic developing machine and amount of silver contained in the developer was measured by atomic absorption spectrometry. This developer was left to stand for 2 days, and presence of precipitate and degree of sticking of black silver to the wall of container were examined. The evaluation was conducted by the following criteria.

×: The precipitate was produced in a large amount or much black silver stuck to the wall of the container.

○: Good conditions. Substantially no precipitate.

The results are shown in Table 1.

TABLE 1

| Kind of polymer latex | The layer to which polymer latex was added and amount thereof | Sensitivity | Gamma | Amount of silver in developer (ppm) | Pressure of precipitate | Sticking of silver to container wall |
|---|---|---|---|---|---|---|
| A | OV 0.20 | 98 | 11.9 | 0.75 | ○ | ○ |
| B | OV 0.20 | 98 | 11.7 | 0.65 | ○ | ○ |
| C | OV 0.20 | 98 | 11.6 | 0.78 | ○ | ○ |
| D | OV 0.20 | 95 | 11.9 | 0.52 | ○ | ○ |
| E | OV 0.20 | 98 | 12.1 | 0.63 | ○ | ○ |
| F | OV 0.20 | 100 | 12.5 | 0.42 | ○ | ○ |
| G | OV 0.20 | 102 | 12.9 | 0.39 | ○ | ○ |
| None | — | 100 | 12.6 | 3.15 | X | X |
| B | OV 0.01 | 100 | 12.6 | 3.02 | X | X |
| B | OV 0.03 | 101 | 12.6 | 2.65 | X | X |
| B | OV 0.05 | 100 | 12.4 | 0.98 | ○ | ○ |
| B | OV 0.10 | 100 | 12.1 | 0.74 | ○ | ○ |
| B | OV 0.50 | 98 | 11.5 | 0.45 | ○ | ○ |
| B | OV 1.00 | 96 | 11.2 | 0.37 | ○ | ○ |
| B | OV 1.50 | 85 | 8.5 | 0.25 | ○ | ○ |
| B | OV 0.20 | 65 | 5.3 | 2.85 | X | X |
| B | OV 0.20 EM 0.20 | 52 | 4.7 | 0.48 | ○ | ○ |

(Note): In the above Table 1, unit of the amount of the polymer latex is g/m². "OV" means overcoat layer and "EM" means emulsion layer and amounts of the polymer latex contained in the respective layers are shown.

As can be seen from the results of Table 1, when the polymer latex is contained in the overcoat layer as in the present invention, the sensitivity does not decrease, enhancement of contrast by the hydrazine derivative is not hindered and besides, dissolution of the silver halide into the developer is little and stain with silver is restrained as compared with the comparative examples. Furthermore, when the polymer latex is contained in an amount greater than the range specified in the present invention, the sensitivity decreases much and enhancement of the contrast by the hydrazine derivative is hindered. Moreover, when the polymer latex is contained in the emulsion layer, the contrast is considerably softened and besides, dissolution of the silver halide into the developer hardly decreases. Therefore, according to the present invention, there can be obtained photosensitive materials which hardly undergo stain with silver even when fine grain emulsion mainly composed of silver chloride is used in order that they can be used under roomlight for a long time with realizing the high contrast by using the hydrazine derivative. This is the long-awaited technique and greatly differs from the conventional techniques disclosed in the patent publications and the like.

Example 2

To a gelatin solution were added 200 mg/m² of Oxonol Yellow manufactured by Hoechst Co., 100 mg/m² of a dye represented by the following formula (C), 50 mg/m² of a dye represented by the following formula (D), a surface active agent, polystyrenesulfonic acid, a matting agent, $1 \times 10^{-4}$ mol/m² of the compound of the formula (I) shown in Table 2 or 1-phenyl-5-mercaptotetrazole (PMT) or 2-mercaptobenzimidazole (MBI) as a comparative compound and a hardener. This gelatin solution was coated on a polyethylene terephthalate film at a coating amount of 3 g/m² in terms of gelatin to form a backcoat.

A gelatino silver chloride emulsion comprising cubic crystals of 0.13 micron in average grain size and containing $6.4 \times 10^{-6}$ mol/mol Ag of rhodium dichloride was prepared by double jet method and subjected to desalting by flocculation method, washing with water and redissolution. To this emulsion were added $2 \times 10^{-3}$ mol/mol Ag of the hydrazine derivative shown by V-27, $4 \times 10^{-3}$ mol/mol Ag of the benzotriazole compound shown by IV-1, $6 \times 10^{-3}$ mol/mol Ag of the tetrazaindene compound shown by II-3, $4 \times 10^{-3}$ mol/mol Ag of the compound shown by III-1, 2-hydroxy-4,6-dichloro-1,3,5-triazine sodium salt and the surface active agent represented by the formula (B). Then, the emulsion was coated on another side of the backcoated film at a coating amount of 5 g/m² in terms of silver nitrate and 3 g/m² in terms of gelatin.

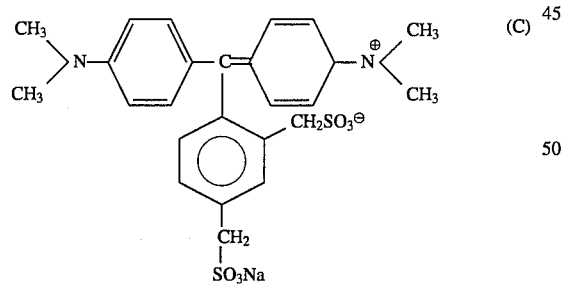

(C)

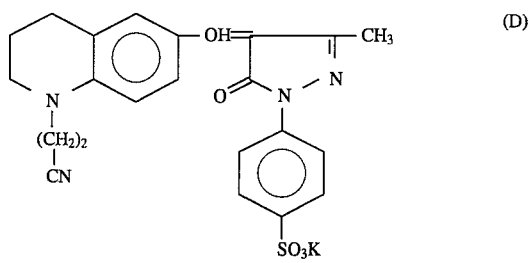

(D)

A coating solution containing 1 g/m² of gelatin, a surface active agent, a hardener, a matting agent and 0.2 g/m² of one of the seven polymer latexes shown in Example 1 was coated on the emulsion layer as a protective layer to obtain the samples as shown in Table 2. As comparative examples, a sample containing no compound represented by the formula (I), a sample containing no polymer latex and a sample containing neither the compound of the formula (I) nor the polymer latex were prepared.

These films were processed in the same manner as in Example 1, and sensitivity and gamma were measured. The sensitivity is relatively expressed assuming the sensitivity of the comparative sample containing neither the compound of the formula (I) nor the polymer latex to be 100.

These films were processed up to 1.2 m² per 1 liter of developer (twice the rate in Example 1) with the same developer and automatic developing machine as used in Example 1 and the amount of silver contained in the developer was measured by atomic absorption spectrometry. This developer was left to stand for 5 days, and presence of precipitate and degree of sticking of black silver to the wall of container were examined.

The results are shown in Table 2.

TABLE 2

| Kind of polymer latex | Compound shown by the formula (I) | Sensitivity | Gamma | Amount of silver in developer (ppm) | Presence of precipitate | Sticking of silver to container wall |
| --- | --- | --- | --- | --- | --- | --- |
| A | I-18 | 98 | 11.9 | 0.45 | ◯ | ◯ |
| B | I-18 | 98 | 11.7 | 0.35 | ◯ | ◯ |
| C | I-18 | 98 | 11.6 | 0.48 | ◯ | ◯ |
| D | I-18 | 95 | 11.9 | 0.42 | ◯ | ◯ |

TABLE 2-continued

| Kind of polymer latex | Compound shown by the formula (I) | Sensitivity | Gamma | Amount of silver in developer (ppm) | Presence of precipitate | Sticking of silver to container wall |
|---|---|---|---|---|---|---|
| E | I-18 | 98 | 12.1 | 0.33 | ○ | ○ |
| F | I-18 | 100 | 12.5 | 0.32 | ○ | ○ |
| G | I-18 | 102 | 12.9 | 0.29 | ○ | ○ |
| None | I-18 | 100 | 12.6 | 2.30 | X | X |
| None | None | 100 | 12.6 | 6.30 | X | X |
| A | I-15 | 98 | 11.5 | 0.43 | ○ | ○ |
| A | I-5 | 97 | 11.6 | 0.48 | ○ | ○ |
| A | I-1 | 99 | 11.7 | 0.47 | ○ | ○ |
| A | PMT | 92 | 11.4 | 4.22 | X | X |
| A | MBT | 95 | 10.4 | 4.24 | X | X |
| A | None | 98 | 12.0 | 4.43 | X | X |

As can be seen from the above results, when the polymer latex is contained in the overcoat layer as in the present invention and the compound of the formula (I) is contained in the backcoat layer, the sensitivity does not decrease, enhancement of contrast by using the hydrazine derivative is not hindered and besides, dissolution of the silver halide into the developer is less even when the photosensitive materials in a larger amount than ordinarily processed are processed with a fixed amount of the processing solution and thus, stain with silver is restrained as compared with the comparative examples. Therefore, it is clear that the embodiment where the polymer latex is contained in the protective layer and the compound of the formula (I) is contained in the backcoat layer is a preferred embodiment for obtaining a photosensitive material which is less in stain with silver.

Example 3

To a gelatin solution were added 200 mg/m$^2$ of Oxonol Yellow manufactured by Hoechst Co., a surface active agent, a matting agent and a hardener. This gelatin solution was coated on a polyethylene terephthalate film at a coating amount of 3 g/m$^2$ in terms of gelatin to form a backcoat.

A gelatino silver chloride emulsion comprising cubic crystals of 0.13 micron in average grain size and containing 6.4×10$^{-6}$ mol/mol Ag of rhodium dichloride was prepared by double jet method and subjected to desalting by flocculation method, washing with water and redissolution. To this emulsion were added 2×10$^{-3}$ mol/mol Ag of the hydrazine derivative shown by V-27, 4×10$^{-3}$ mol/mol Ag of the benzotriazole compound shown by IV-1, 6×10$^{-3}$ mol/mol Ag of the tetrazaindene compound shown by II-3, 4×10$^{-3}$ mol/mol Ag of the compound shown by III-1, 2-hydroxy-4,6-dichloro-1,3,5-triazine sodium salt, the surface active agent represented by the formula (B) and furthermore, 20 mg/m$^2$ of the following water-soluble polymer having acid group as shown in Table 3. Then, the emulsion was coated on another side of the backcoated film at a coating amount of 5 g/m$^2$ in terms of silver nitrate and 3 g/m$^2$ in terms of gelatin. As comparative example, a sample which did not contain the water-soluble polymer having acid group was also prepared.

P-1: Polymer of polystyrenesulfonic acid (molecular weight: 500,000).

P-2: Copolymer of polystyrenesulfonic acid and maleic anhydride (3:1 in molar ratio) (molecular weight: 10,000)

P-3: Polymer of polyacrylic acid (molecular weight: 40,000)

A coating solution containing 1 g/m$^2$ of gelatin, a surface active agent, a hardener, a matting agent and 0.2 g/m$^2$ of the polymer latex shown in Example 1 was coated on the emulsion layer as a protective layer to obtain the samples as shown in Table 3. As comparative example, a sample containing no polymer latex was also prepared.

These films were processed in the same manner as in Example 1, and sensitivity and gamma were measured. The sensitivity is relatively expressed assuming the sensitivity of the comparative sample containing no polymer latex to be 100.

These films were processed up to 0.6 m$^2$ per 1 liter of developer with the same developer as used in Example 1 in a polyethylene beaker and the amount of silver contained in the developer was measured by atomic absorption spectrometry. This developer was left to stand for 2 days, and the degree of sticking of black silver to the wall of container (stain with silver) was examined. Furthermore, the same developer was left to stand for 7 days to exhaust it by oxidation with air and then, a sample exposed through a fine line original (positive) of 30 microns was developed with the exhausted developer and the rupture of the fine lines (negative) was examined.

The results are shown in Table 3.

TABLE 3

| Kind of polymer latex | Polymer having acid group | Sensitivity | Gamma | Amount of silver in developer (ppm) | Rupture of image | Stain with silver |
|---|---|---|---|---|---|---|
| A | None | 95 | 11.5 | 1.50 | X | ○ |
| A | P-1 | 96 | 12.0 | 1.40 | ○ | ○ |
| B | None | 95 | 11.6 | 1.35 | X | ○ |
| B | P-1 | 98 | 11.9 | 1.50 | ○ | ○ |
| B | P-2 | 95 | 12.0 | 1.45 | ○ | ○ |

TABLE 3-continued

| Kind of polymer latex | Polymer having acid group | Sensitivity | Gamma | Amount of silver in developer (ppm) | Rupture of image | Stain with silver |
|---|---|---|---|---|---|---|
| B | P-3 | 98 | 11.6 | 1.55 | O | O |
| C | None | 95 | 11.6 | 1.68 | X | O |
| C | P-1 | 98 | 12.0 | 1.60 | O | O |
| D | None | 93 | 11.5 | 1.23 | X | O |
| D | P-1 | 98 | 12.0 | 1.30 | O | O |
| E | None | 95 | 11.7 | 1.35 | X | O |
| E | P-1 | 98 | 12.0 | 1.25 | O | O |
| F | None | 95 | 11.8 | 1.09 | X | O |
| F | P-1 | 98 | 12.0 | 0.98 | O | O |
| G | None | 96 | 11.3 | 1.05 | X | O |
| G | P-1 | 98 | 12.0 | 1.26 | O | O |
| None | None | 100 | 12.6 | 4.26 | O | X |

As can be seen from the results shown in Table 3, when the polymer latex is contained in the overcoat layer and the water-soluble latex having acid group is contained in the emulsion layer as in the present invention, irrespective of the kind of the polymer latex, enhancement of contrast by using the hydrazine derivative is not hindered and besides, dissolution of the silver halide into the developer is less and the stain with silver is restrained and in addition, the contrast enhancement phenomenon which occurs due to the hydrazine derivative does not become excessive even when a developer exhausted with lapse of time is used and good images of high contrast can be obtained as compared with the comparative examples. Therefore, it is clear that the embodiment where the polymer latex is contained in the overcoat layer and the water-soluble polymer having acid group is contained in the emulsion layer is a preferred embodiment for restraining stain with silver, preventing the contrast enhancement phenomenon caused by the hydrazine derivative from becoming excessive even with use of the developer exhausted with lapse of time, and obtaining good images of high contrast.

Example 4

To a gelatin solution were added 200 mg/m² of Oxonol Yellow manufactured by Hoechst Co., a surface active agent, a matting agent, 0.9 g/m² of one of the polymer latexes A-G used in Example 1 and a hardener. This gelatin solution was coated on a polyethylene terephthalate film at a coating amount of 3 g/m² in terms of gelatin to form a backcoat. A comparative sample containing no polymer latex in the backcoat layer was also prepared.

A gelatino silver chloride emulsion comprising cubic crystals of 0.13 micron in average grain size and containing $6.4 \times 10^{-6}$ mol/mol Ag of rhodium dichloride was prepared by double jet method and subjected to desalting by flocculation method, washing with water and redissolution. To this emulsion were added $2 \times 10^{-3}$ mol/mol Ag of the hydrazine derivative shown by V-27, $4 \times 10^{-3}$ mol/mol Ag of the benzotriazole compound shown by IV-1, 2-hydroxy-4,6-dichloro-1,3,5-triazine sodium salt and the surface active agent represented by the formula (B). Then, the emulsion was coated on another side of the eight backcoated films at a coating amount of 5 g/m² in terms of silver nitrate and 3 g/m² in terms of gelatin.

A coating solution containing 1 g/m² of gelatin, a surface active agent, a hardener, a matting agent and 0.4 g/m² of one of the polymer latexes A-G used in Example 1 was coated on the emulsion layer as a protective layer to obtain the samples as shown in Table 4-1. As comparative example, a sample containing no polymer latex was also prepared.

These films were processed in the same manner as in Example 1, and gamma was measured.

Furthermore, in order to evaluate the registration, the sample was exposed to a negative original of register marks which was positioned by a pin bar so as to form the register marks as shown in FIG. 1 and processed with the above developer. The negative register marks of the original had a line width of 80 microns. The same procedure was conducted 4 times using the same original on the different days and the four prints were superimposed by a pin bar and deviation in registration was examined. When the register marks of the four prints exactly met, this is graded to be 3. When one of the four prints deviated at at least one portion of the registers and could not be used as a contact reversal printing photosensitive material for color printing, this is graded to be 2, and when the registers deviated at several portions, this is graded to be 1.

Moreover, both sides of the samples were observed to evaluate whether the layer was uniformly coated or not. The evaluation was carried out by projecting a reflected light and a transmitted light on the surface of the both sides of the samples. The sample superior in both sides is graded to be 3, the sample which was partially inferior in uniformity of the coat on at least one side and could not be used as a contact reversal printing photosensitive material for color printing is graded to be 2, and the sample which was inferior in uniformity of the whole surface of the coat on at least one side is graded to be 1.

The results are shown in Table 4-1.

TABLE 4-1

| Polymer latex | | | | |
|---|---|---|---|---|
| Photosensitive layer side | Backcoat layer side | Registration | Gamma | Coatability |
| A | B | 3 | 11.5 | 3 |
| B | A | 3 | 11.6 | 3 |
| B | B | 3 | 11.6 | 3 |
| B | C | 3 | 11.6 | 3 |
| B | D | 3 | 11.6 | 3 |
| B | E | 3 | 11.6 | 3 |
| B | F | 3 | 11.6 | 3 |
| B | G | 3 | 11.6 | 3 |
| B | None | 1 | 11.6 | 3 |
| C | B | 3 | 11.6 | 3 |

TABLE 4-1-continued

| Polymer latex | | | | |
|---|---|---|---|---|
| Photosensitive layer side | Backcoat layer side | Registration | Gamma | Coatability |
| D | B | 3 | 11.5 | 3 |
| E | B | 3 | 11.7 | 3 |
| F | B | 3 | 11.8 | 3 |
| G | B | 3 | 11.3 | 3 |
| None | B | 2 | 12.6 | 3 |
| None | None | 1 | 12.6 | 3 |

The photosensitive materials containing the polymer latex on both sides in Table 4-1 are the photosensitive materials of the present invention in which the weight ratio of polymer latex/gelatin on the side having the photosensitive layer (hereinafter referred to as "RATIO-1") is 0.1 and the weight ratio of polymer latex/gelatin in the backcoat layer (hereinafter referred to as "RATIO-2") is 0.3 and furthermore, no polymer latex is contained in the photosensitive layer. As can be seen from Table 4-1, the samples of the, present invention are superior in registration without damaging the contrast for all of the polymer latexes to the samples of the comparative examples which does not contain the polymer latex on the photosensitive layer side and/or the backcoat layer side. It is further seen that the effects can also be exhibited even if the kinds of the polymer latexes differ on the backcoat layer side and the photosensitive layer side.

Furthermore, samples were prepared in the same manner as shown in Table 4-1 except that the polymer latex of the formula (B) was contained in the layers on both sides (contained only in the backcoat layer and the overcoat layer and not contained in the photosensitive layer) and the amounts of the polymer latex contained in these layers were changed as shown in Table 4-2.

These samples were processed in the same manner as in Example 1 and were evaluated on easiness of registration and coatability. The results are shown in Table 4-2.

TABLE 4-2

| Photosensitive layer side | | Backcoat side | | | |
|---|---|---|---|---|---|
| Amount of latex | RATIO-1 | Amount of latex | RATIO-2 | Registration | Coatability |
| 0.04 | 0.01 | 0.90 | 0.30 | 2 | 3 |
| 0.08 | 0.02 | 0.90 | 0.30 | 3 | 3 |
| 0.20 | 0.05 | 0.90 | 0.30 | 3 | 3 |
| 0.40 | 0.10 | 0.90 | 0.30 | 3 | 3 |
| 0.80 | 0.20 | 0.90 | 0.30 | 3 | 3 |
| 1.20 | 0.30 | 0.90 | 0.30 | 3 | 2 |
| 0.40 | 0.10 | 0.30 | 0.10 | 1 | 3 |
| 0.40 | 0.10 | 0.45 | 0.15 | 3 | 3 |
| 0.40 | 0.10 | 0.90 | 0.30 | 3 | 3 |
| 0.40 | 0.10 | 1.80 | 0.60 | 3 | 3 |
| 0.40 | 0.10 | 2.70 | 0.90 | 3 | 1 |

In the above Table, amount of latex is in g/m².

As can be seen from the results shown in Table 4-2, the samples in which the weight ratio of polymer latex/gelatin on the photosensitive layer side is in the range of 0.02–0.2 and that on the backcoat layer side is in the range of 0.15–0.6 are improved in registration without deteriorating the coatability. That is, that the weight ratio of the polymer latex/gelatin is within the above ranges is a preferred embodiment for obtaining a high contrast roomlight photosensitive material having a sufficient maximum density which is excellent in registration and handleability.

Example 5

A gelatino silver chloride emulsion comprising cubic crystals of 0.13 micron in average grain size and containing $6.4 \times 10^{-6}$ mol/mol Ag of rhodium dichloride was prepared by double jet method. This emulsion was subjected to desalting by flocculation method, washing with water and redissolution. This emulsion was divided and to each of the emulsions were added $2 \times 10^{-3}$ mol/mol Ag of the hydrazine derivative shown by V-27, $6 \times 10^{-3}$ mol/mol Ag of the tetrazaindene compound of the present invention shown by the formula (II) as shown in Table 5 or the comparative compound shown by the following formula (II-a), $4 \times 10^{-3}$ mol/mol Ag of the compound shown by III-1, 2-hydroxy-4,6-dichloro-1,3,5-triazine sodium salt and the surface active agent shown by the formula (B). Then, the emulsion was coated on the surface side of polyethylene terephthalate film (backcoated with a gelatin solution containing 200 mg/m² of Oxonol Yellow of Hoechst Co., a hardener, a surface active agent and a matting agent) at a coating amount of 5 g/m² in terms of silver nitrate and 3 g/m² in terms of gelatin.

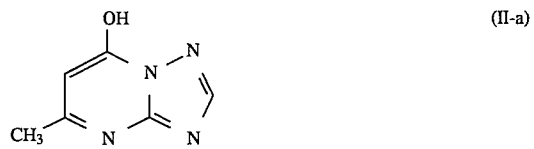

A coating solution containing 1 g/m² of gelatin, the surface active agent shown by the formula (B), 2-hydroxy-4,6-dichloro-1,3,5-triazine sodium salt and one of the following matting agents A–E in an amount as shown in Table 5 was coated on the emulsion layer as a protective layer.

A: Cyroid 244 manufactured by Fuji Davidson Co., Ltd. (average particle size 1.8 micron)

B: Polystyrene beads manufactured by Japan Synthetic Rubber Co., Ltd. (average particle size 3.2 micron)

C: Cyroid 308 manufactured by Fuji Davidson Co., Ltd. (average particle size 3.5 micron)

D: Cyroid 404 manufactured by Fuji Davidson Co., Ltd. (average particle size 5.2 micron)

E: Cyroid 162 manufactured by Fuji Davidson Co., Ltd. (average particle size 5.5 micron)

Furthermore, comparative samples containing 40 mg/m² of Oxonol Yellow of Hoechst Co. in the emulsion layer or the overcoat layer as shown in Table 5 were also prepared.

These films were subjected to black solid exposure with which 52% flat dot was made from 50% flat dot original by a roomlight printer (P-627FM manufactured by Dainippon Screen Mfg. Co., Ltd.) and developed with the same developer as used in Example 1 at 38° C. for 20 seconds, followed by fixing, washing with water and drying. For this processing, an automatic developing machine (LD-221QT manufactured by Dainippon Screen Mfg. Co., Ltd.) was used. The resulting black solid image was observed by a 10× loupe on a light table and the state of formation of pinholes was evaluated by the following three grades.

3: Substantially no pinholes are formed.

2: Some pinholes are formed, but this is practically acceptable.

1: Many pinholes are formed and the sample cannot be used.

In order to evaluate the vacuum performance, the samples were exposed through the above 50% flat dot original under the condition of 80% in relative humidity by the same printer and at the same exposure as above (after drawing a vacuum for 8 seconds) and processed in the same manner as above. It was examined whether the resulting dot image had blurred portion or not.

Furthermore, in order to evaluate the sharpness of the resulting image, the samples were exposed through a negative and positive line originals of 20 microns in line width by the same printer and at the same exposure as above and processed in the same manner as above. The resulting image was observed by a 100× loupe and the sharpness was evaluated by ○ (good) and × (bad).

The results are shown in Table 5.

Thus, that the tetrazaindene compound shown by the formula (II) is contained, a matting agent of smaller than 5.5 microns is contained in an amount of 5–50 mg/m² and substantially no dye which reduces the sensitivity of the photosensitive emulsion is contained in any layers on the photosensitive layer side of the support is a preferred embodiment for obtaining a photosensitive material which is less in formation of pinholes, produces no blurred portion in the image and can give images of high sharpness.

TABLE 5

| Tetrazaindene compound | Dye | Matting agent | Amount of matting agent mg/m² | Pinhole | Blur | Sharpness of image |
|---|---|---|---|---|---|---|
| II-3 | None | C | 30 | 3 | None | ○ |
| II-4 | None | C | 30 | 3 | " | ○ |
| II-5 | None | C | 30 | 3 | " | ○ |
| II-9 | None | C | 30 | 3 | " | ○ |
| II-a | None | C | 30 | 3 | " | X |
| None | None | C | 30 | 3 | " | X |
| II-3 | OV Layer | C | 30 | 1 | " | ○ |
| II-3 | EM layer | C | 30 | 1 | " | ○ |
| II-3 | None | A | 2 | 3 | Present | ○ |
| II-3 | None | A | 5 | 3 | None | ○ |
| II-3 | None | A | 50 | 3 | " | ○ |
| II-3 | None | A | 80 | 1 | " | ○ |
| II-3 | None | B | 2 | 3 | Present | ○ |
| II-3 | None | B | 5 | 3 | None | ○ |
| II-3 | None | B | 50 | 3 | " | ○ |
| II-3 | None | B | 80 | 1 | " | ○ |
| II-3 | None | C | 2 | 3 | Present | ○ |
| II-3 | None | C | 5 | 3 | None | ○ |
| II-3 | None | C | 50 | 2 | " | ○ |
| II-3 | None | C | 80 | 1 | " | ○ |
| II-3 | None | D | 2 | 3 | Present | ○ |
| II-3 | None | D | 5 | 2 | None | ○ |
| II-3 | None | D | 50 | 2 | " | ○ |
| II-3 | None | D | 80 | 1 | " | ○ |
| II-3 | None | E | 2 | 2 | Present | ○ |
| II-3 | None | E | 5 | 1 | None | ○ |
| II-3 | None | E | 50 | 1 | " | ○ |
| II-3 | None | E | 80 | 1 | " | ○ |

As can be seen from the results of Table 5, when the tetrazaindene compound shown by the formula (II) is contained, a matting agent of smaller than 5.5 microns is contained in an amount of 5–50 mg/m² and substantially no dye which reduces the sensitivity of the photosensitive emulsion is contained in any layers of the photosensitive layer side, only a few pinholes are formed, no blurred portion is present in the image and the sharpness of the image is high. On the other hand, when the tetrazaindene compound of the formula (II) is not contained or the comparative compound II-a is contained, the sharpness of the resulting image is inferior. Furthermore, when the dye which reduces the sensitivity of the photosensitive emulsion is contained in the emulsion layer or the overcoat layer, many pinholes are formed. Moreover, when a matting agent having a particle size of 5.5 microns is used, many pinholes are formed and the photosensitive materials cannot be used irrespective of the amount of the added matting agent. Further, even when the matting agent having a particle size in the range of the present invention is used, vacuum performance is inferior if the amount of the matting agent is smaller than the range specified in the present invention and many pinholes are formed if the amount is larger than the range of the present invention. There is seen no difference in the results when the matting agent is of silica type and when it is of polymer type.

Example 6

A gelatino silver chloride emulsion comprising cubic crystals of 0.13 micron in average grain size and containing $6.4 \times 10^{-6}$ mol/mol Ag of rhodium dichloride was prepared by double jet method. This emulsion was subjected to desalting by flocculation method, washing with water and redissolution. This emulsion was divided and to each of the emulsions were added $1 \times 10^{-3}$ mol/mol Ag of the hydrazine derivative shown by the formula (V), $3 \times 10^{-3}$ mol/mol Ag of the mercapto compound shown by the formula (III), $6 \times 10^{-3}$ mol/mol Ag of the tetrazaindene compound shown by the formula (II) or the comparative compound shown by the formula (II-a) as shown in Table 6, 2-hydroxy-4,6-dichloro-1,3,5-triazine sodium salt and the surface active agent shown by the formula (B). Then, the emulsion was coated on the surface side of a polyethylene terephthalate film (backcoated with a gelatin solution containing 200 mg/m² of Oxonol Yellow of Hoechst Co., a hardener, a surface active agent and a matting agent) at a coating amount of 5 g/m² in terms of silver nitrate and 3 g/m² in terms of gelatin. A coating solution containing 1 g/m² of gelatin, a surface active agent, a hardener and a matting agent was coated on the emulsion layer as a protective layer to prepare the samples as shown in Table 6.

The film obtained was subjected to exposure and development in the same manner as in Example 1, and gamma was measured. Furthermore, in order to test the safety against safelight, the following two tests were conducted. First, the film was subjected to an exposure with which 50% flat dot is made from 50% flat dot original and developed to obtain a standard sample. Separately, the film was left to stand for 20 minutes under a roomlight of 300 lux from which ultraviolet ray was removed, namely, a fluorescent lamp Toshiba FL40SWNU and then, exposed at the same exposure as used for preparing the standard sample and developed, and change in dot % was measured (ΔDot=x-50 when the dot % is x % upon exposure to the safelight). Furthermore, the film was exposed to the same safelight for 60 minutes and then developed, and change in Dmin was measured as safelight fog.

Moreover, in order to examine the characteristics when the film is processed with a developer increased in activity due to exhaustion with lapse of time, the following test was conducted. In the same manner as in the above test on the safety against the safelight, the film was exposed at an exposure with which 50% flat dot is made from 50% dot original and developed with a fresh developer to obtain a standard sample. Separately, the film was exposed at the same exposure as in preparation of the standard sample and developed with a developer which was left for one week in an open container, and change in dot % was measured in the same manner as above.

The results are shown in Table 6.

compound of the formula (II), other tetrazaindene compound is contained, increase in dot area ratio when a developer exhausted due to lapse of time is great or safety against safelight is low. Thus, use of the mercapto compound of the formula (III) and the tetrazaindene compound of the formula (II) in the roomlight photosensitive material of the present invention is a preferred embodiment for obtaining a roomlight photosensitive material which is less in increase in dot area ratio with maintaining the high contrast characteristic when a developer exhausted due to lapse of time is used and which is high in safety against safelight even when the material contains the hydrazine compound of the formula (V) disclosed in U.S. Pat. No. 4,816,373 and Japanese Patent Kokai Nos. 62-275247 and 63-253357 which causes less uneven development and less generation of pepper fog, but causes great increase in sensitivity when a development exhausted due to lapse of time.

Example 7

A gelatino silver chloride emulsion comprising cubic crystals of 0.13 micron in average grain size and containing $6.4 \times 10^{-6}$ mol/mol Ag of rhodium dichloride was prepared by double jet method. This emulsion was subjected to desalting by flocculation method, washing with water and redissolution. This emulsion was divided and to each of the emulsions were added $2 \times 10^{-3}$ mol/mol Ag of the hydrazine derivative shown by the formula (V), $4 \times 10^{-3}$ mol/mol Ag of the benzotriazole compound shown by the formula (IV) or

TABLE 6

| Hydrazine derivative | Mercapto compound | Tetrazaindene compound | Safelight test | | Ehausted developer test | |
|---|---|---|---|---|---|---|
| | | | Fog | ΔDot | ΔDot | Gamma |
| None | III-1 | II-3 | 0.00 | ±0 | ±0 | 7.8 |
| V-2 | III-1 | II-3 | 0.00 | ±0 | +1 | 12.8 |
| V-9 | III-1 | II-3 | 0.00 | ±0 | +1 | 13.2 |
| V-12 | III-1 | II-3 | 0.01 | +1 | +2 | 13.5 |
| V-27 | III-1 | II-3 | 0.01 | ±0 | +1 | 14.8 |
| V-28 | III-1 | II-3 | 0.01 | +1 | +1 | 15.2 |
| V-30 | III-1 | II-3 | 0.01 | +1 | +2 | 14.5 |
| V-31 | III-1 | II-3 | 0.01 | +1 | +2 | 14.3 |
| V-27 | None | None | 0.18 | +5 | +18 | 16.3 |
| V-27 | III-1 | None | 3.52 | +25 | +3 | 14.6 |
| V-27 | III-1 | II-a | 3.23 | +23 | +3 | 14.4 |
| V-27 | III-1 | II-i | 0.02 | +2 | +2 | 13.8 |
| V-27 | III-1 | II-4 | 0.01 | +1 | +1 | 15.2 |
| V-27 | III-1 | II-5 | 0.01 | +1 | +2 | 14.7 |
| V-27 | III-1 | II-6 | 0.02 | +2 | +2 | 14.3 |
| V-27 | None | II-3 | 0.03 | +3 | +12 | 15.8 |
| V-27 | III-4 | II-3 | 0.02 | +2 | +2 | 14.5 |
| V-27 | III-7 | II-3 | 0.01 | +1 | +2 | 13.6 |
| V-27 | III-10 | II-3 | 0.01 | +1 | +2 | 13.3 |

From the results of Table 6, it can be seen that roomlight photographic photosensitive materials which can provide good images, are less in increase of dot area ratio even when processed with a developer enhanced in activity due to exhaustion with lapse of time with maintaining the high contrast characteristic and have a high safety against safelight can be obtained by using the compounds of the formulas (II), (III) and (V) in combination. On the other hand, when both the compounds of the formulas (II) and (III) are not contained, increase in dot area ratio when a developer exhausted due to lapse of time is great. Furthermore, when either one of the compounds of the formulas (II) and (III) is not contained or in place of the tetrazaindene the following comparative compound (IV-a), $6 \times 10^{-3}$ mol/mol Ag of the tetrazaindene compound shown by the formula (II) or the comparative compound shown by formula (II-a) and $4 \times 10^{-3}$ mol/mol Ag of the compound shown by the formula (III-1) as shown in Table 7, 2-hydroxy-4,6-dichloro-1,3,5-triazine sodium salt and the surface active agent shown by the formula (B). Then, the emulsion was coated on the surface side of a polyethylene terephthalate film (backcoated with a gelatin solution containing 200 mg/m² of Oxonol Yellow of Hoechst Co., a hardener, a surface active agent and a matting agent) at a coating amount of 5 g/m² in terms of silver nitrate and 3 g/m² in terms of gelatin. A coating solution containing 1 g/m² of gelatin, a surface active agent, a hardener and a matting agent was coated on the emulsion layer as a protective layer to prepare the samples as shown in Table 7.

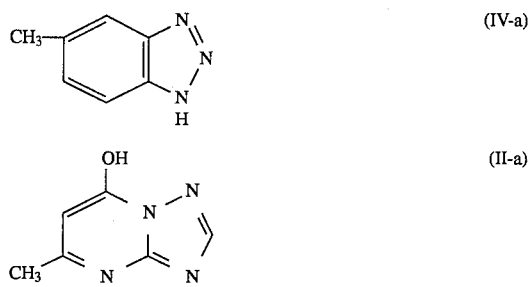

These films were processed in the same manner as in Example 1 and gamma was measured. Furthermore, they were subjected to the test for safety against safelight in the same manner as in Example 6.

The results are shown in Table 7.

TABLE 7

| Hydrazine derivative | Benzotriazole compound | Tetra-zaindene compound | Safe-light fog | ΔDot | Gamma |
|---|---|---|---|---|---|
| V-2 | IV-1 | II-3 | 0.00 | +1 | 11.9 |
| V-9 | IV-1 | II-3 | 0.00 | +1 | 12.2 |
| V-12 | IV-1 | II-3 | 0.00 | +1 | 12.5 |
| V-27 | IV-1 | II-3 | 0.00 | ±0 | 12.6 |
| V-29 | IV-1 | II-3 | 0.01 | ±0 | 13.4 |
| V-30 | IV-1 | II-3 | 0.01 | ±0 | 12.9 |
| V-31 | IV-1 | II-3 | 0.01 | ±0 | 12.2 |
| V-27 | IV-1 | II-5 | 0.00 | ±0 | 12.2 |
| V-27 | IV-1 | II-9 | 0.01 | +1 | 12.5 |
| V-27 | IV-2 | II-3 | 0.00 | ±0 | 12.7 |
| V-27 | IV-2 | II-5 | 0.00 | ±0 | 11.9 |
| V-27 | IV-2 | II-9 | 0.00 | +1 | 11.9 |
| V-27 | IV-6 | II-3 | 0.00 | ±0 | 11.8 |
| V-27 | IV-6 | II-5 | 0.00 | ±0 | 11.7 |
| V-27 | IV-6 | II-9 | 0.01 | +1 | 12.1 |
| V-27 | IV-1 | None | 2.59 | +11 | 13.9 |
| V-27 | None | II-3 | 0.96 | +5 | 13.0 |
| V-27 | None | None | 2.77 | +12 | 10.2 |
| V-27 | IV-a | II-3 | 1.05 | +8 | 8.7 |
| V-27 | IV-1 | II-a | 2.89 | +13 | 13.1 |

From the results of Table 7, it can be seen that roomlight photographic photosensitive materials which can provide good images and have a high safety against safelight with maintaining the high contrast characteristic can be obtained by using the compounds of the formulas (II), (IV) and (V) in combination. On the other hand, not only when both the compounds of the formulas (II) and (IV) are not contained, but also when either one of the compounds of the formula (II) and (IV) is not contained, when in place of the tetrazaindene compound of the formula (II), other tetrazaindene compound is contained or when in place of the benzotriazole compound of the formula (IV), other benzotriazole compound is contained, safety against safelight is low. Thus, use of the benzotriazole compound of the formula (IV), the tetrazaindene compound of the formula (II) and the hydrazine derivative of the formula (V) in the roomlight photosensitive material of the present invention is another preferred embodiment for obtaining the safety against safelight.

What is claimed is:

1. A silver halide photographic photosensitive material comprising a support and, provided thereon, at least one hydrophilic colloid layer including a photosensitive layer wherein the photosensitive layer comprises monodispersed silver halide grains having an average grain size of 0.2 micron or less and comprising at least 90 mol % of silver chloride, the photosensitive layer or a hydrophilic colloid layer provided on the same side of the support as the side on which the photosensitive layer is provided contains a hydrazine derivative, a hydrophilic colloid layer provided above the photosensitive layer contains a water-dispersible fine particle polymer, the photosensitive layer contains substantially no water-dispersible fine particle polymer, and amount of the water-dispersible fine particle polymer contained in the hydrophilic colloid layer is 1 g/m² or less and is 5% by weight or more based on the weight of gelatin contained in the hydrophilic colloid layer.

2. A silver halide photographic photosensitive material according to claim 1 wherein a backcoat layer provided on the side of the support opposite to the side on which the photosensitive layer is provided contains a compound represented by the following formula (I):

$$X_1-SM_1 \qquad (I)$$

wherein $X_1$ represents a heterocyclic residue to which at least one hydrophilic group directly or indirectly bonds and $M_1$ represents a hydrogen atom, an alkali metal, a quaternary ammonium or a quaternary phosphonium.

3. A silver halide photographic photosensitive material according to claim 1 wherein the photosensitive layer and/or other hydrophilic colloid layer contain a water-soluble polymer having an acid group.

4. A silver halide photographic photosensitive material according to claim 1 wherein the weight ratio of the water-dispersible fine particle polymer and gelatin which are contained in all of the hydrophilic colloid layers including the photosensitive layer provided on the side of the support on which the photosensitive layer is provided is 0.02–0.2 and the weight ratio of the water-dispersible fine particle polymer and gelatin which are contained in all of the hydrophilic colloid layers provided on the side of the support opposite to the side on which the photosensitive layer is provided is 0.15–0.6.

5. A silver halide photographic photosensitive material according to claim 1 wherein the silver halide grains in the photosensitive layer contains a water-soluble rhodium salt in an amount of $5 \times 10^{-7}$–$2 \times 10^{-4}$ mol based on 1 mol of the silver halide.

6. A silver halide photographic photosensitive material according to claim 1 wherein the photosensitive layer or other hydrophilic colloid layer contains a compound represented by the following formula (II), the hydrophilic colloid layer provided above the photosensitive layer contains a matting agent having an average particle size of smaller than 5.5 microns in an amount of 5–50 mg/m² and the layers provided on the side of the support on which the photosensitive layer is provided contain substantially no dye which reduces the sensitivity of the photosensitive emulsion:

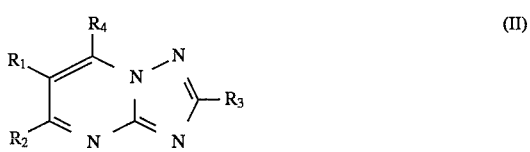

wherein $R_1$, $R_2$ and $R_3$ which are identical or different each represent a hydrogen atom, a substituted or unsubstituted alkyl group, a substituted or unsubstituted alkenyl group or an alkylthio group, $R_1$ and $R_2$ may form together a 5- or 6-membered ring and the total number of the carbon atoms of $R_1$ and $R_2$ is 3 or more, and $R_4$ represents a hydroxy group or a mercapto group.

7. A silver halide photographic photosensitive material according to claim 1 wherein the photosensitive layer or other hydrophilic colloid layer contains the compound represented by the formula (II) and a compound represented by the following formula (III):

Z-S-M$_2$  (III)

wherein M$_2$ represents a hydrogen atom or a cation and Z represents a heterocyclic residue containing at least one nitrogen atom and the heterocyclic residue may further be condensed.

8. A silver halide photographic photosensitive material according to claim 1 wherein the photosensitive layer or other hydrophilic colloid layer contains the compound represented by the formula (II) and a compound represented by the following formula (IV):

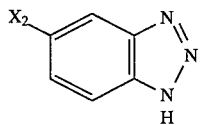  (IV)

wherein X$_2$ represents a substituent having a Hammett's value σp of +0.15–+0.70.

9. A silver halide photographic photosensitive material according to claim 6, wherein the photosensitive layer or other hydrophilic colloid layer further contains a compound represented by the following formula (V):

  (V)

(wherein Ar represents an aryl group and R represents a group —OR$_5$ or a group —N(R$_6$)(R$_7$) in which R$_5$ represents a hydrogen atom, a substituted or unsubstituted alkyl group, a substituted or unsubstituted alkenyl group, a substituted or unsubstituted heterocyclic group or a substituted or unsubstituted aryl group and R$_6$ and R$_7$ each represents a hydrogen atom, a substituted or unsubstituted alkyl group, a substituted or unsubstituted aryl group, a substituted or unsubstituted heterocyclic group or a substituted or unsubstituted pyridinium group and R$_6$ and R$_7$ may link to each other to form a ring.

10. A silver halide photographic photosensitive material according to claim 7 wherein the photosensitive layer or other hydrophilic colloid layer further contains a compound represented by the following formula (V):

  (V)

wherein Ar represents an aryl group and R represents a group —OR$_5$ or a group —N(R$_6$)(R$_7$) in which R$_5$ represents a hydrogen atom, a substituted or unsubstituted alkyl group, a substituted or unsubstituted alkenyl group, a substituted or unsubstituted heterocyclic group or a substituted or unsubstituted aryl group and R$_6$ and R$_7$ each represents a hydrogen atom, a substituted or unsubstituted alkyl group, a substituted or unsubstituted aryl group, a substituted or unsubstituted heterocyclic group or a substituted or unsubstituted pyridinium group and R$_6$ and R$_7$ may link each other to form a ring.

11. A silver halide photographic photosensitive material according to claim 8 wherein the photosensitive layer or other hydrophilic colloid layer further contains a compound represented by the following formula (V):

  (V)

wherein Ar represents an aryl group and R represents a group —OR$_5$ or a group —N(R$_6$)(R$_7$) in which R$_5$ represents a hydrogen atom, a substituted or unsubstituted alkyl group, a substituted or unsubstituted alkenyl group, a substituted or unsubstituted heterocyclic group or a substituted or unsubstituted aryl group and R$_6$ and R$_7$ each represents a hydrogen atom, a substituted or unsubstituted alkyl group, a substituted or unsubstituted aryl group, a substituted or unsubstituted heterocyclic group or a substituted or unsubstituted pyridinium group and R$_6$ and R$_7$ may link each other to form a ring.

* * * * *